(12) United States Patent
Tanaka et al.

(10) Patent No.: US 7,567,317 B2
(45) Date of Patent: Jul. 28, 2009

(54) LIQUID CRYSTAL DISPLAY APPARATUS

(75) Inventors: Toshiaki Tanaka, Kodaira (JP); Hiroki Kaneko, Hitachinaka (JP); Ikuo Hiyama, Hitachinaka (JP)

(73) Assignee: Hitachi Displays, Ltd., Chiba (JP)

( * ) Notice: Subject to any disclaimer, the term of this patent is extended or adjusted under 35 U.S.C. 154(b) by 297 days.

(21) Appl. No.: 11/580,915

(22) Filed: Oct. 16, 2006

(65) Prior Publication Data

US 2007/0085944 A1  Apr. 19, 2007

(30) Foreign Application Priority Data

Oct. 17, 2005  (JP) .............................. 2005-301119
Apr. 14, 2006  (JP) .............................. 2006-111502

(51) Int. Cl.
*G02F 1/1335* (2006.01)
(52) U.S. Cl. .......................................... 349/69; 349/61
(58) Field of Classification Search ..................... 349/69
See application file for complete search history.

(56) References Cited

U.S. PATENT DOCUMENTS

2006/0157724 A1* 7/2006 Fujita .......................... 257/99

FOREIGN PATENT DOCUMENTS

| JP | 05-013816 | 1/1993 |
|---|---|---|
| JP | 10-107316 | 4/1998 |
| JP | 2002-151739 | 5/2002 |
| JP | 2004-207655 | 7/2004 |
| JP | 2004-235441 | 8/2004 |
| JP | 2004-363572 | 12/2004 |

\* cited by examiner

*Primary Examiner*—Sung H Pak
(74) *Attorney, Agent, or Firm*—Antonelli, Terry, Stout & Kraus, LLP.

(57) ABSTRACT

A cold-cathode tube has hitherto been used as a backlight for supplying illumination to a liquid crystal television but recently, light emitting diode pieces have been used for a backlight of a large-size liquid crystal television. For the purpose of improving the emission efficiency, flip chip mounting of the light emitting diode piece is advantageous but the mounting yield is restricted by the piece size, electrode structure and wire pattern structure, facing situations having difficulties in realizing simplified mounting and reduction of costs of members. In a liquid crystal display apparatus having a liquid crystal panel, an optical system and a light source, the light source includes a light emitting element structure having positive and negative electrodes, at least one of them being plural, and wires mounted to the positive and negative electrodes through flip chip mounting by making electrical correspondence to individual regions of the positive and negative electrodes.

19 Claims, 38 Drawing Sheets

LIQUID CRYSTAL DISPLAY APPARATUS

BACKGROUND OF THE INVENTION

The present invention relates to liquid crystal display apparatuses.

In the liquid crystal display apparatus, a cold cathode tube has hitherto been used as a backlight source but recently, a module having a semiconductor light emitting diode (LED) element applied to the backlight source has been developed for liquid crystal televisions. In a compact liquid crystal panel for use in a cell phone, a white light source having a blue semiconductor light emitting diode element and a yellow fluorescent substance in combination has been used for backlight. But for medium and large size liquid crystal display panels, an LED backlight module is needed in which LED elements for three primary colors of red, green and blue are built in and they are controlled independently to improve the color display performance with high picture quality.

In constituting the backlight module, it is important that the LED element to be mounted is highly efficient in order to reduce consumptive power as far as possible. The LED element mounted on the backlight is structured more advantageously in the flip chip mounting form characteristic of a wide divergence having the ability to take out a large quantity of light from a transparent substrate than in the bonding mounting form using a gold wire. The flip-chip element can optically have emission efficiency nearly twice that of the wire bonding element but electrically, it faces a problem that the current density distribution in the element is localized or biased to make the emission intensity distribution non-uniform. For this reason, an improvement needs to be made to provide uniform emission intensities in different directions and attain an intended high brightness.

In the wire bonding mounting, too, an improvement must be made to attain an electrically uniform current density distribution and there needs a countermeasure including a structural form and a light take-out structure with a view to improving the emission efficiency.

In known prior arts trying to cope with these problems, the shape of electrode is contrived and besides a current diffusion layer is applied in order that the current distribution in the light emitting diode element can be uniform as indicated in JP-A-2004-363572 by Toshiki Yoshiuji et al and JP-A-2002-151739 by Ryouichi Takeuchi et al. In JP-A-5-13816 by Masaki Mori et al, a trail is made to provide an insulating film between electrodes for the sake of avoiding electrical short-circuit between the electrodes and realizing steady mounting with a high yield in the course of mounting a flip-chip element. In JP-A-10-107316 by Masayoshi Koike et al, a method is described according to which a plurality of electrically separated operating regions are formed in a single LED element integrally therewith and individual regions are electrically connected by a surface electrode pattern to reduce steps in die bonding and wire bonding, thus reducing costs. In JP-A-2004-235441 by Seishi Tamura et al and JP-A-2004-207655 by Tatsumi Setomoto et al, methods are described in which with a view to mounting an LED element to a wiring substrate with high accuracy, a wiring pattern is contrived and an alignment mark shape is so contrived as to be introduced to a substrate.

SUMMARY OF THE INVENTION

The present invention contemplates a liquid crystal display apparatus comprised of an LED backlight module carrying LED elements constituting a light source and a liquid crystal panel as well and intends to provide a mounting structure capable of assuring the compatibility between high efficiency and sizable large size of an LED element constituting the backlight, which compatibility cannot be obtained with the prior arts known till now, and facilitating wire mounting by way of exemplified flip chip mounting.

In making an attempt to increase the size of the LED element for flip chip mounting with the aim of realizing high brightness in the prior art, the area of electrodes swells and uniform distribution of current density from positive electrode to negative electrode is difficult to achieve, raising a problem that a sufficient improvement cannot be made even when the prior art interdigitated array electrode or lattice electrode as above is applied. With the element sized largely to cope with this problem, the emission efficiency is diminished, thus making it necessary to meet a trade-off between sizableness/area enlargement and emission efficiency of the element. This holds true for an LED element for wire bonding mounting.

For performing flip chip mounting in a small-sized LED element, a highly fine wiring pattern is necessary and a highly precise mounting technique is needed and therefore, preparation of a highly fine wiring substrate applied with a high-cost process is required. Accordingly, it is a must that tolerance of an underlying wiring pattern be increased to facilitate mounting by increasing the element in size and enlarging the electrode pattern.

An object of the present invention is to provide a structure capable of satisfying the incompatible requirement conditions so as to realize highly efficient characteristics and high brightness based on size enlargement which fail to be achieved with the prior arts, permit application of simplified mounting and materialize an element, a wiring substrate and a mounting structure which are commensurate with high yields and low costs.

Structurally, in the present invention, means for maintaining and improving emission efficiency of an LED element structure constituting a backlight source of a liquid crystal display apparatus is contrived and simplified mounting and cost reduction are contrived as well, as will be described below.

According to the present invention, in an LED element structure mounted to a backlight module of a liquid crystal apparatus, consumptive power in the backlight module can be reduced by materializing a wire mounting contrivance which maintains and improves the emission efficiency of the element structure. In the conventional LED element, as the size increases, non-uniformity of current density in the element is aggravated and brightness and optical output in relation to current density is decreased, with the result that the emission efficiency is relatively decreased in comparison with that in a small-size element. If a large current is passed through the small-size element to obtain a high output with high brightness, the emission efficiency of the element is degraded on account of heat generation due to a high current density and reduced recombination probability due to a high carrier density. For these reasons, it is of great importance to obtain characteristics of high output with high brightness based on sizable enlarged-area while maintaining the emission efficiency of the small-size element.

To this end, according to the present invention, the area of an element structure is contrived to be enlarged by keeping the area of an emission layer or region as well as the size and shape of an electrode unchanged with a view to not changing the current density of a small-size unit element and converting only a cyclic arrangement of unit elements and an arrangement of electrodes to purposed desired arrangements.

Firstly, this will be reviewed from the standpoint of an LED element structure. According to teachings of the present invention, a cyclically formed unit element of minimum unit is not cut out of a wafer having cyclic small-size unit elements each of which has predetermined emission layer and electrode structures but a contrivance is made to form a large-size element structure which is as large as integer times the minimum unit element size by providing a desired electrode arrangement which is a center symmetrical electrode arrangement. By converting and modifying an electrode pattern and by setting up a center symmetrical electrode pattern arrangement, positive and negative electrode regions are discriminated, and a large-size element can be implemented. Means to this end is for constituting a large-size LED element structure by connecting light emission regions of minimum unit in parallel, thus personating element enlarging means. Correspondingly, the enlarged element size can swell to integer times the unit element size of minimum unit. Principally, twice, triple or quadruple of the minimum unit size is efficient. Since the uniformity of current density and emission efficiency in the unit element of minimum unit can be maintained in this manner, degradation of emission efficiency depending on the element size does not take place even when the size of an element structure increases to twice, thrice or quadruple of the minimum unit. Further, as to the problem that with the element size increased, the electrode area swells correspondingly and the current density usually becomes non-uniform depending on the electrode area, the teachings of the present invention can keep the non-uniformity of current density from exceeding that in the unit element size of minimum unit.

According to the teachings of the invention, a large-size LED element structure is produced by connecting regions of minimum unit in parallel but the emission efficiency in a light emission region constituting the minimum unit can remain unchanged and maintained and even with the size enlarged, no degradation in the efficiency occurs to advantage. Usually, as the size of the LED element structure increases, the electrode area swells correspondingly, giving rise to the aforementioned problem that the non-uniformity of current density increases and a region of small current density expands. This leads to a situation that maintenance of the emission efficiency is difficult in the usual large-size element structure as compared to the small-size element structure. Normally, even if a large current is applied to the small-size element structure to obtain a high output with high brightness, generation of Joule heat and saturation of carrier density due to the current density cause the emission efficiency to lower. In contrast, according to the teachings of the invention, since the parallel connection of small-size unit elements of minimum unit is employed structurally, the emission efficiency of the small-size unit element can be assured structurally and besides the enlarged size can envisage characteristics of high output with high brightness. Advantageously, according to the teachings of the invention, even in the case of the enlarged size, applied current can be distributed to small-size unit elements of minimum unit and consequently the emission efficiency thanks to the low current side can play fully. More specifically, the emission efficiency is relatively good on the low current side of the small-size unit element and therefore, in the large-size element structure obtained by connecting the small-size unit elements in parallel, the high emission efficiency can be maintained up to a large current range. In principle, when the large-size element structure is integer times the unit element of minimum unit, there is a possibility that the larger the multiplier, the higher the large current till which the emission efficiency can be maintained becomes.

Further, when positive electrodes and negative electrodes constituted in individual unit elements of minimum unit size are merged, respectively, to provide respective resultant singular regions, the regions of positive and negative electrodes in a large element structure which is integer times the minimum unit element can respectively be enlarged equivalently. In addition, by making connection while matching polarities to the individual mergence resultant regions, electrical conduction in the course of mounting can be assured. By establishing electrical connection to the individual regions of positive and negative electrodes, respectively, of the large element structure, connection can be set for a parallel circuit in which each minimum unit of LED unit element behaves as a single diode piece. Through this, even under the condition that high brightness is obtained by requiring a large current to be passed through a single element of minimum unit as in the past, current can be equivalently distributed to the individual unit elements in the parallel circuit to reduce the applied current per minimum unit element, so that the applied current can be suppressed in each unit element by an inverse of integer corresponding to the applied element structure size of integer multiple. In other words, even when an applied current in excess of a rating is required for a single element structure, the applied current can be set to the rating in the one minimum unit size in the sizable element structure constructed according to the teachings of the present invention. In this manner, the rating optical output and brightness under the rating operation condition can be attained and therefore, reliability of the LED unit element representing each constituent unit can be improved and reliability of the enlarged element structure can be assured as well.

With the construction according to the teachings of the present invention, when a single basic unit element of minimum unit is developed as a product, the method for enlargement can be simplified in procedures and can be facilitated as will be described below. Usually, in developing a newly enlarged element, conditions for photo-mask and photolithography must be changed in some processes and conditions for etching process must also be changed; and besides an element produced must be guaranteed against its reliability dependent on the process and conditions. This accounts for the fact that for assurance of the reliability, much time needs to be consumed for development. But according to the teachings of the invention, individual conditions in the production process need not be changed and essentially, mere modification of the photo-mask pattern for electrode suffices to cope with the situation. Practically, mere modification of photo-masks for neighboring processes necessary for change of the electrode pattern suffices and hence process conditions and management can advantageously be dealt with quite similarly. This sufficiently complies with simplified modification of process and therefore, in comparison with an element to be newly developed for enlargement, the element or element structure of the invention can be completed at low costs. According to the teachings of the invention, in enlarging the element structure, the relatively low cost process and simplified flip chip mounting thanks to the enlargement of the electrode area can be realized. Similar advantages can also be expected in the wire bonding mounting.

A description will now be given from the standpoint of mounting. According to the teachings of the present invention, the flip chip mounting having difficulties in yield and in scheme of mounting of a small-size element can be facilitated. In an element structure according to the teachings of the invention, even when a region of positive electrode and a region of negative electrode in a region of minimum unit are formed separately, individual positive electrode regions and individual negative electrode regions are set to be connectable as an assembly and can be merged equivalently. Electrical connection of the element structure can be carried out at high yields as the electrode area of the element structure increases. Namely, in case the element structure size is enlarged to multiple times the minimum unit element, when the conventional small-size unit element shaped to be of an element of about 0.3 mm square in which a minimum electrode of about 0.1 mm square is formed, the minimum area of electrode can swell to twice, thrice or quadruple. Since the wiring pattern on a substrate can also be expanded correspondingly in compliance with the electrode area, flip chip mounting can be facilitated. Especially when bumps of Au or solder are formed on the electrode of element structure, highly precise flip chip mounting to the underlying wiring substrate can be permitted. Further, since the separated positive and negative electrodes can be handled as electrodes equivalently enlarged in area, electrical connection of element structure can be assured sufficiently even when, for example, bumps are plated on the substrate wiring side. The enlargement of wiring pattern by virtue of the increase in the element electrode area can overcome the problem that flip chip mounting in the small-size element cannot be handled speedily and at high yields. In mounting the element to the substrate wiring through the medium of the bumps, speedy and steady flip chip mounting can be realized at high yield through the alignment of the element side or wiring side. Thus, the element structure enlarged according to the teachings of the invention can not only improve characteristics of emission efficiency and high output with high brightness but also assure high yield and highly reliable flip chip mounting of the element structure, thereby ensuring that the mounted element structure or package or the module can be produced at low costs to advantage.

Specified means for carrying out the present invention are as follows.

According to an embodiment of the present invention, in a liquid crystal display apparatus comprising a liquid crystal panel, an optical system and a light source, the light source includes a light emitting element structure having positive and negative electrodes, at least one of them being plural, and wires mounted to the positive and negative electrodes through flip chip mounting by making electrical correspondence to individual regions of the positive and negative electrodes. Even an element structure subject to wire bonding mounting of one-wire mount type or two-wire mount type can be constructed similarly.

Further, the light emitting element structure has a positive electrode constructed as mergence of singular positive electrodes of individual light emitting unit elements of minimum unit and a negative electrode constructed as mergence of singular negative electrodes of the individual light emitting unit elements of minimum unit. Then, because the light emitting element structure has its positive electrode as mergence of singular positive electrodes of individual light emitting unit elements and its negative electrode as mergence of singular negative electrodes of the individual light emitting unit elements, the light emitting element structure has an intensity of light corresponding to the sum of intensities of light of a plurality of light emitting unit elements of minimum unit. Then, the plurality of light emitting unit elements of minimum unit elements each having a singular positive electrode and a singular negative electrode are mounted in parallel to the wires. The light source includes a substrate transparent to a wavelength of light emitted from the light emitting element structure. A plurality of light emitting element structures are connected in series by the wiring. The light emitting unit elements of minimum unit are cyclically arranged to enable their positive electrodes or negative electrodes to be merged. Particularly, two, three or four of the light emitting unit elements of minimum unit are arranged cyclically. The wiring is laid on a metallic substrate or ceramic substrate through an insulating layer so that the light emitting element structure may have a breakdown voltage of 1 kV or more. The light emitting unit element includes a white light emitting piece comprised of a yellow fluorescent substance and a blue light emitting diode piece which are sealed with resin, a white light emitting piece comprised of green and red fluorescent substances and a blue light emitting diode piece which are sealed with resin or a white light emitting piece comprised of three primary light sources of blue, green and red light emitting diode pieces.

Further, the light source of the liquid crystal display apparatus can also be used as a backlight of liquid crystal display for use in a cell phone, personal computer or television.

According to another embodiment of the invention, a plurality of wires are laid on a substrate, a plurality of light emitting unit elements each having a positive electrode and a negative electrode are connected to the wires and every two or more of the plurality of light emitting unit elements are formed in a pattern which permits their positive electrodes or negative electrodes to be merged.

Each of the two or more pattern-formed light emitting unit elements is connected to the wires in pattern. Then, the light emitting unit elements are flip-chip mounted to the wires. A similar structure is adopted in an element subject to wire bonding mounting of one-wire mount type or two-wire mount type.

The individual sets of two or more of pattern-formed light emitting unit elements are connected in series with the wires while being connected in parallel to the wires. Each of the pattern-formed light emitting elements includes two, three or four light emitting pieces.

The liquid crystal display apparatus comprises the light source and a liquid crystal panel.

Advantageously, in the present invention, consumptive power in the backlight module representing a light source of LED element structure for use in the liquid crystal display apparatus can be reduced. This advantage is due to the fact that high brightness can be attained by increasing the size without degrading the uniformity of current density distribution in the LED unit element and light can be taken out from the transparent substrate side on account of the flip chip mounting, so that the emission efficiency can be improved nearly twice in comparison to the case of wire bonding mounting. With the current efficiency and power efficiency promoted nearly twice, the consumptive power can be reduced for maintaining the same brightness. In other words, with the efficiency improved, the same brightness can be attained with a smaller number of mounted LED unit elements, thus reducing the number of LED unit elements and consequently reducing the consumptive power to advantage. Even in an element structure subject to wire bonding mounting, the construction of the present invention can be applied to ensure that improvements in efficiency and reduction of consumptive power can be expected as compared to the case of conventional element structure.

In the phase of mounting, simplified mounting can be allowed and the yield of mounting can be improved to advantage. This is because with the size of element structure increased, the electrode pattern can be swelled and bumps formed on the highly symmetrical electrode pattern can be positioned in good balance to the wiring pattern. In comparison with an element structure of relatively small area, the accuracy of positioning can be improved and the yield of flip chip mounting using thermo crimp or ultrasonic crimp can be promoted.

Further, as compared to the case where an electrode pattern is newly developed by increasing the size of a light emitting diode element constituting a light source, an element structure of enlarged area having a plurality of electrodes by using unit elements of small area put on market can obviously be reduced in costs to advantage. This is because in the small-size unit element which has already been commercialized, the technique for electrode formation and the electrode pattern are promoted up to the technique meeting products, sufficiently upgrading the yield and reliability, and therefore conditions for processes are settled and the element shape is stable. In the present invention, quite the same process conditions can be applied by merely changing the mask necessary for periodicity of electrode patterns. Thus, the high process yield and mounting yield can be maintained.

By improving the emission efficiency of the element structure as a whole, the compatibility between low consumptive power and low cost can be assured. Because of materialization of the high process yield and high mounting yield and dispensability of a new element structure, the element structure can be formed at relatively low costs.

Other objects, features and advantages of the invention will become apparent from the following description of the embodiments of the invention taken in conjunction with the accompanying drawings.

DESCRIPTION OF THE INVENTION

The best mode for carrying out the present invention will be described hereunder.

Embodiment 1

A first embodiment of the invention will first be described with reference to FIGS. 1 to 30.

Figure 1:
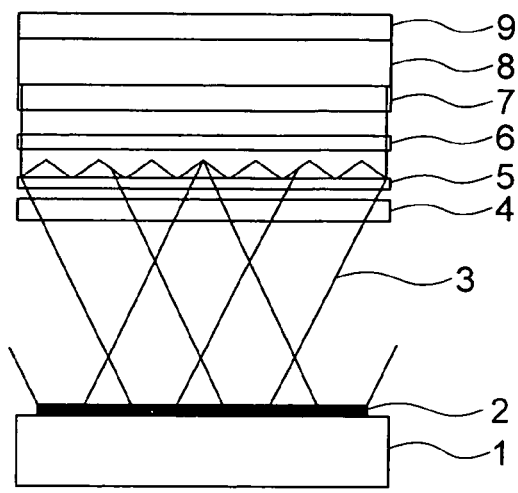
FIG. 1 is a sectional view of a liquid crystal panel display apparatus for television using a light emitting diode element backlight module according to the present invention.
Figure 2:
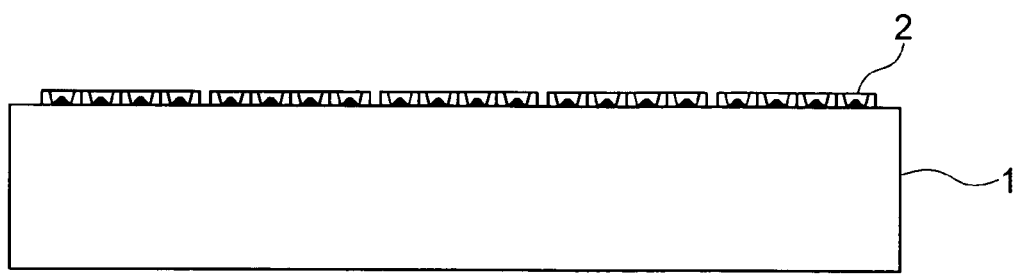
FIG. 2 is a sectional view of the backlight module using a light emitting diode element structure according to the invention.
Figure 3:
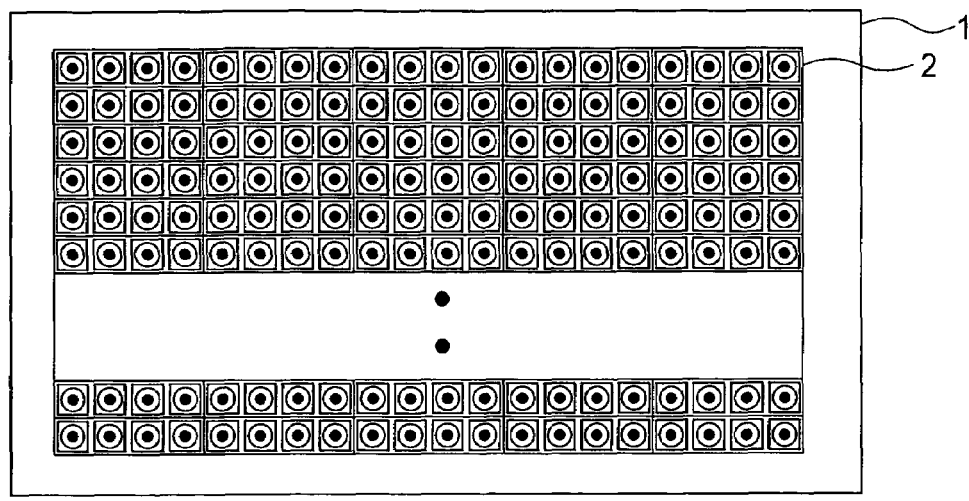
FIG. 3 is a top view of the backlight module using the light emitting diode element structure according to the invention.

Teachings of the present invention mainly contemplate features of a light emitting diode element structure and its mounting form. Referring first to FIG. 1, there is illustrated, in sectional form, a liquid crystal display apparatus for television in which the light emitting diode element structure according to the embodiment of the invention is mounted. A module is constructed by having light emitting diode unit elements 2 carried on a backlight module housing 1. Rays of backlight 3 emitted from the light emitting diode element structure transmit through a diffusion plate 4, a positive prism sheet 5, a diffusion film 6, a lower polarization plate 7, a thin film transistor and liquid crystal panel 8 for television and an upper polarization plate 9, thereby illuminating the liquid crystal panel display apparatus.

The light emitting diode element structure and its mounting form of the present embodiment are built in the backlight module constituting the liquid crystal panel display apparatus. The backlight module housing 1 and light emitting diode unit elements 2 carried thereon are configured as shown in sectional form in FIG. 2 and in top view form in FIG. 3. By electrically connecting unit elements forming a wiring substrate and further connecting an external control circuit, the backlight module of the present invention can be driven to operate. In order to maintain the reliability of the light emitting diode element structure, a protection circuit using, for example, Zener diodes can be built efficiently in the wiring substrate or external control circuit. A light source constituting the backlight module is constructed by cyclically arranging a unit structure as exemplified in FIGS. 4 and 5. Even when the size of the liquid crystal panel changes, the backlight module complying with any size can be constructed by making the cycle number and arrangement for reiteration of the unit structure shown in FIGS. 4 and 5 correspondingly.

Figure 4:
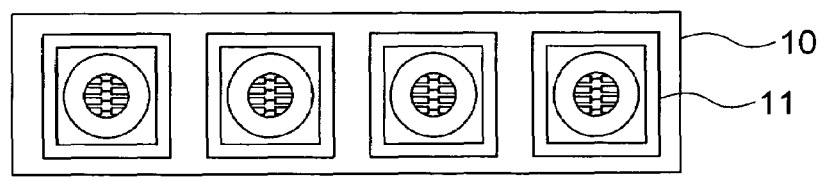
FIG. 4 is a top view showing a unit structure according to the invention.
Figure 5:
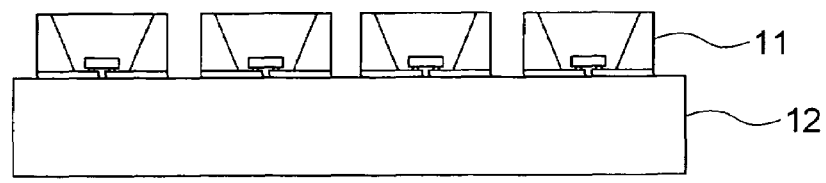
FIG. 5 is a sectional view showing the unit structure of the invention.
Figure 6:
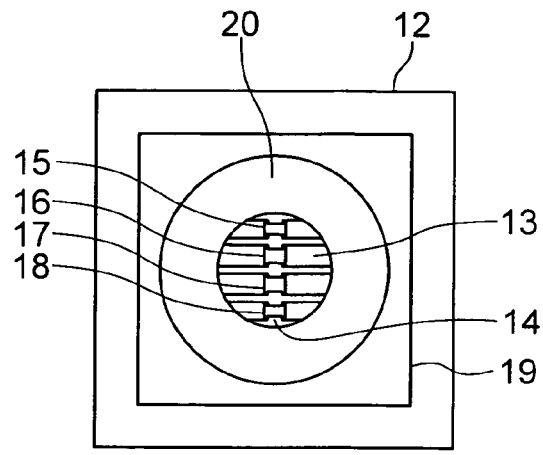
FIG. 6 is a top view showing a cell package carrying a light emitting diode unit element of the invention.
Figure 7:
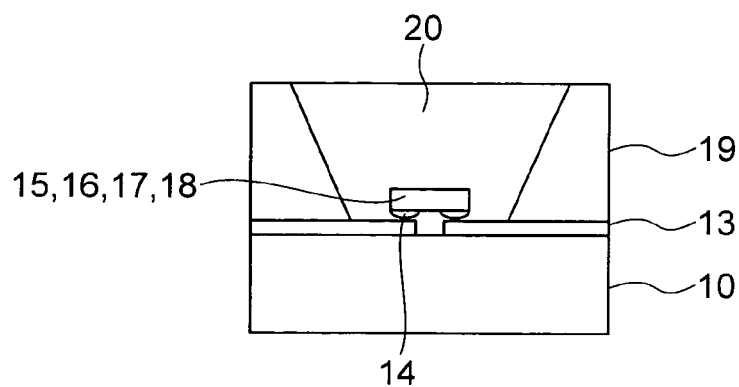
FIG. 7 is a sectional view showing the cell package carrying a light emitting diode unit element of the invention.
Figure 8:
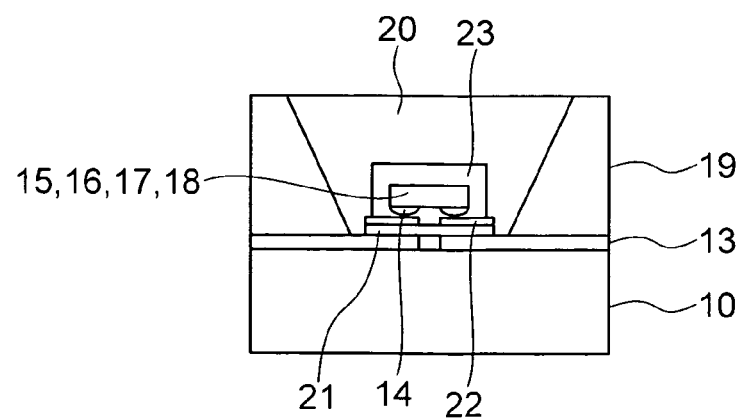
FIG. 8 is a sectional view showing a different cell package carrying a light emitting diode unit element of the invention.

The unit structure shown in FIGS. 4 and 5 can be constructed by providing a cell package 11 carrying a light emitting diode unit element on a metallic substrate with insulating layer, ceramic substrate or glass-epoxy composite substrate 10. The cell package is illustrated in top view form and sectional form in FIGS. 6 and 7, respectively. The cell package is formed by first providing wires 13 for individual light emitting diode pieces on an element wiring substrate 12, flip-chip mounting a blue light emitting diode piece 15, a green light emitting diode piece 16, a green light emitting diode piece 17 and a red light emitting diode piece 18 through the medium of gold bumps 14 and thereafter providing a reflection plate 19 and sealing the diode pieces with transparent resin 20. Illustrated in FIG. 8 is another form of mounting/sealing of the light emitting diode pieces. Excepting a mounting form around the light emitting diode pieces, the mounting/sealing form in FIG. 8 is the same as that for the cell package shown in FIG. 7. In FIG. 8, each of the light emitting diode pieces 15, 16, 17 and 18 is mounted on wires 22 formed on a foundation substrate, sub-mount or support 21 through gold bumps 14 and subsequently, sealed with transparent resin or resin containing fine particles 23, thus forming separately or individually mounted diode pieces. The individually mounted diode pieces are carried on the cell package shown in FIG. 7 to provide a different type of cell package in a manner similar to FIG. 7. Production of the individually mounted diode pieces has two features and advantages as below. In the first place, by virtue of the individual mounting, characteristics of each piece can be grasped discriminately through inspection and therefore, even when characteristics distribute differently for individual light emitting diode pieces, the distribution of characteristics can be managed and the individual diode pieces can be distributed. Namely, in the backlight module, distribution based on adjustment of illumination degree and color tone, which is made throughout the liquid crystal panel display apparatus by taking into account the brightness and chromaticity in accordance with levels of characteristics of the individual diode pieces, can be assured. Such a distribution that pieces for which brightness is high and color tone is made up precisely can be arranged at a liquid crystal panel central portion and pieces of low rank of characteristics are configured at a liquid crystal panel peripheral portion can be assured. The arrangement and distribution of the diode pieces as above can be designed and managed in accordance with requested specifications of illumination degree and color tone. In the second place, as the transparent resin for sealing the diode piece, resin of high refractive index or resin mixed with fine particles of high refractive index can be used during mounting of the individual pieces to thereby improve the efficiency of take-out light from each piece. This ensures that emission components internal of the piece which can not be taken out of the piece by itself can be taken out and the external quantum efficiency of the diode piece can be improved to advantage.

Figure 9:
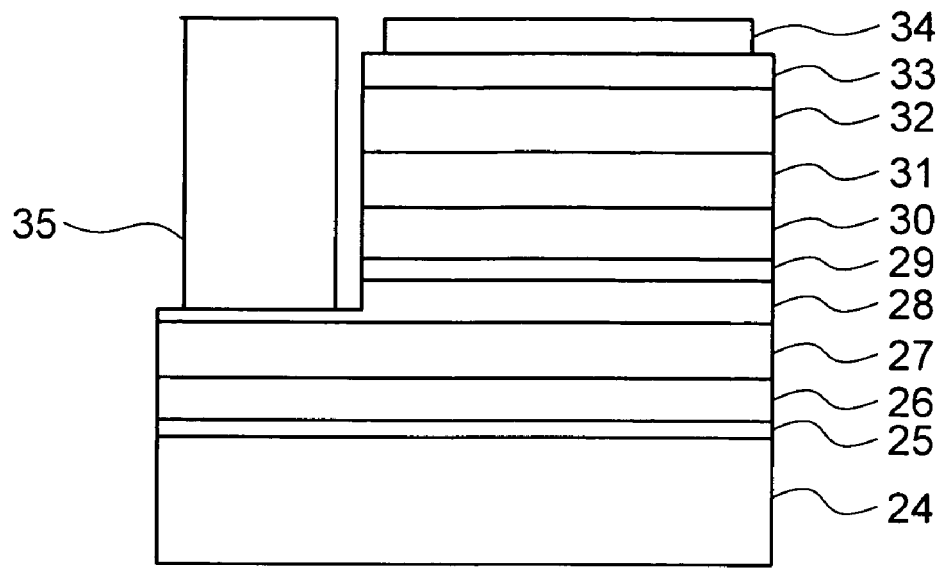
FIG. 9 is a sectional view of a crystal layer structure of a blue or green light emitting diode piece.
Figure 10:
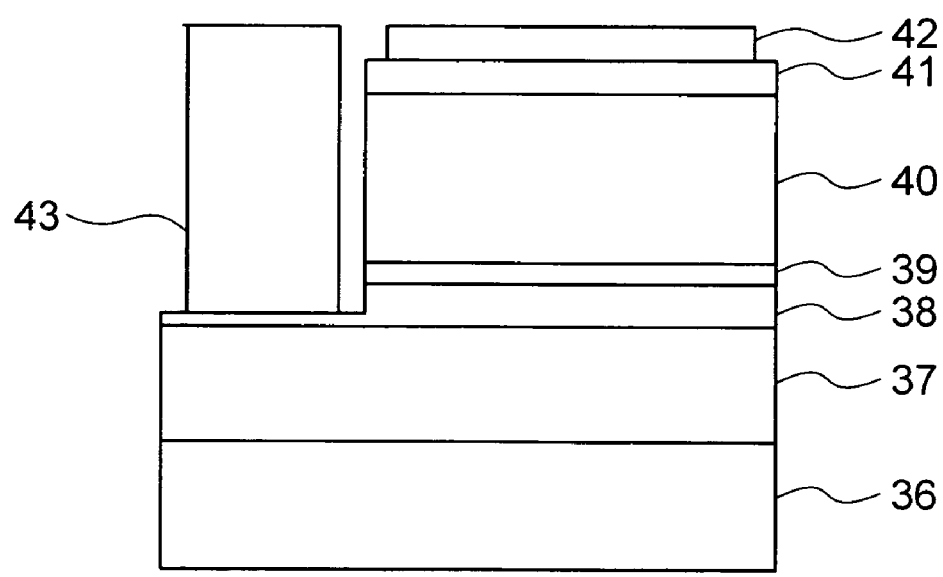
FIG. 10 is a sectional view of a crystal layer structure of a red light emitting diode piece.

Features of a light emitting diode piece in the present embodiment will be described below. As will be seen from FIGS. 9 and 10, the light emitting diode piece is similar in sectional structure to the conventional one to permit flip chip mounting. Illustrated in sectional form in FIG. 9 is a blue or green light emitting diode piece. Typically, on a sapphire single crystal substrate or GaN single crystal substrate 24, a GaN buffer layer 25, a GaN layer 26, an n-type GaN/AlGaN super lattice layer 27, an n-type GaN/AlGaN guide layer 28, an InGaN/GaN/AlGaN multi-quantum well emission layer 29, a p-type GaN/AlGaN guide layer 30, a p-type GaN/AlGaN super lattice layer 31, a p-type GaN/AlGaN layer 32 and a p-type GaN layer 33 are crystal-grown and thereafter, a p-side positive electrode 34 is provided through liftoff by photolithography and electrode vapor deposition. Subsequently, the resulting structure is etched until the layer 28 through photolithography and etching process and then an n-side negative electrode 35 of large thickness is formed. In this manner, the coplanar positive and negative electrodes 34 and 35 applicable to flip chip mounting can be formed. Either the blue or the green light emitting diode piece can be produced by mainly adjusting an In composition of InGaN quantum well layer in the InGaN/GaN/AlGaN multi-quantum well emission layer 29. Illustrated in sectional form in FIG. 10 is a red light emitting diode piece. In a typical production process, the piece is produced by providing the following semiconductor layers which are bonded, on the midway of the production process, to a substrate 36 turning into a transparent substrate or GaP substrate in the final step. In crystal growth, a p-type AlGaInP layer 37, a p-type GaInP/AlGaInP layer 38, a GaInP/AlGaInP multi-quantum well emission layer 39, an n-type AlGaInP layer 40 and an n-type GaInP/AlGaInP layer 41 are formed and thereafter, an n-side negative electrode 42 is provided through liftoff by photolithography and electrode vapor deposition. Subsequently, the resulting structure is etched until the layer 38, thus forming a p-side positive electrode 43 of large thickness. In this manner, the coplanar negative and positive electrodes 42 and 43 which are applicable to the flip chip mounting can be formed. Through the process as above, the red light emitting diode piece can be produced.

Figure 11:
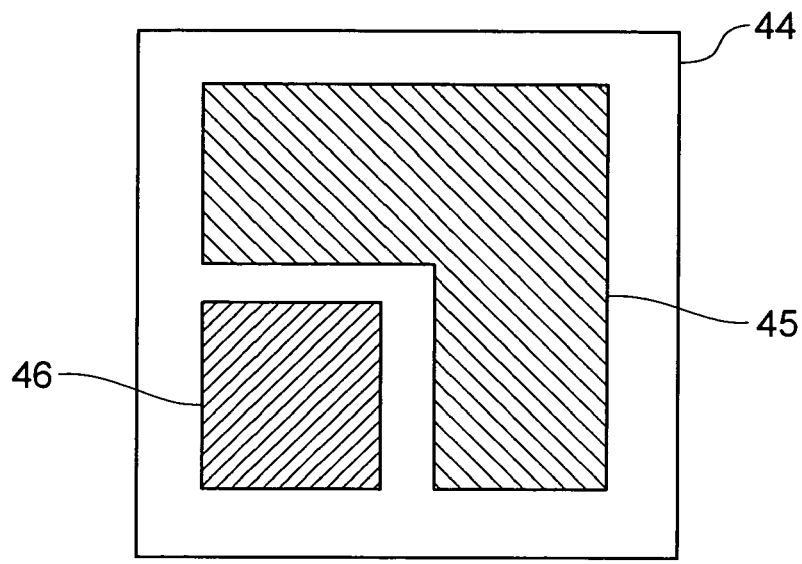
FIG. 11 is a top view showing an electrode pattern of a conventional light emitting diode element structure of small area.
Figure 12:
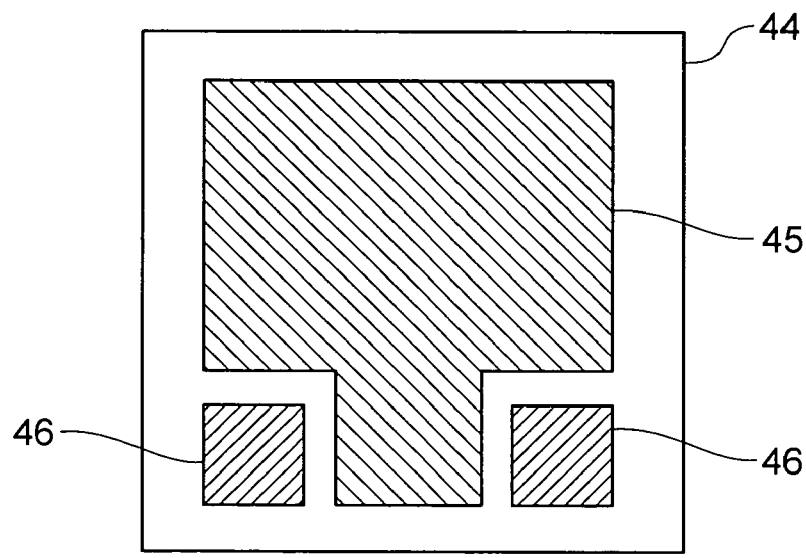
FIG. 12 is a top view showing an electrode pattern of a conventional light emitting diode element structure of large area.
Figure 13:
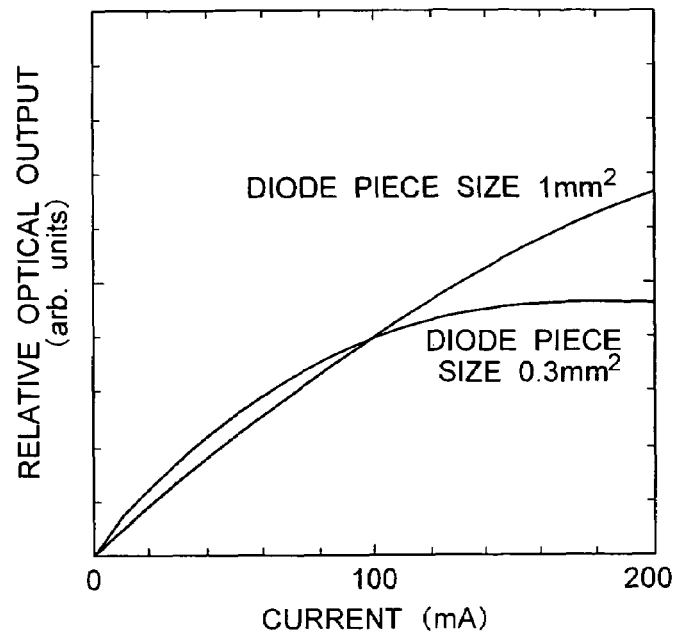
FIG. 13 is a graph showing the relation between relative optical output depending on the size of light emitting diode piece and current.

In the aforementioned individual light emitting diode pieces, the laminated crystal layers and the substrate are similar to those in the conventional piece. But the electrode structure and pattern are characteristic of the present invention as will be described below. The electrode structure and pattern in a conventional piece will first be explained with reference to FIGS. 11 and 12. An element of 0.3 mm square size as an example of a small area and an element of 1 mm square size as an example of a large area are illustrated in FIGS. 11 and 12, respectively, to show electrode patterns of positive and negative electrodes 45 and 46 formed on an underlying semiconductor layer 44 of the light emitting diode piece. These diode pieces have different electrode patterns and in each piece, the electrode pattern and arrangement is set so that uniformity of current can be maintained as far as possible throughout the piece. In the large area piece, however, an electrode structure effective to increase the area of an emission region is contradictory with an electrode structure effective to obtain uniform current, setting up a trade-off therebetween. Accordingly, the current distribution is relatively more non-uniform in the piece of large area than in the piece of small area and the emission efficiency is degraded in the piece of large area. Because of the large area of the emission region, the current density can be small to permit larger current to pass, with the result that the efficiency is degraded on the one hand but high brightness can be attained on the other hand. Contrarily, in order for operation to be performed under condition of high emission efficiency at the cost of relatively reduced brightness per piece, the piece of small area is preferable. This situation will be described with reference to FIG. 13. The relation between relative optical output and applied current is calculated for the diode pieces of small and large areas and an example of calculation results is shown in FIG. 13. In the piece of small area, under the low current operation condition, for example, at 100 mA or less in FIG. 13, the efficiency can be high and high output with high brightness can be obtained. On the other hand, under the high current operation condition, for example, at 100 mA or more in FIG. 13, heat dissipation is insufficient in the small-sized piece and the efficiency is degraded, so that the situation reverses itself to permit the characteristics of the large area piece to gain an advantage. When the above situations are taken into consideration, by keeping the emission efficiency high through the use of the small area piece under as low a current operation condition as possible, the backlight module can be driven at lower consumptive power. In addition, since the use under a high emission efficiency operation condition can be allowed, the number of pieces to be mounted can be set properly so as to be suppressed to a minimum. This contributes to a low consumptive power and low cost technique and to the construction of a low cost backlight module as well. In other words, with a diode piece of high emission efficiency designed and the number of pieces reduced to a minimum, compatibility between low consumptive power and low cost can be assured in the backlight module having the diode pieces arranged.

Figure 14:
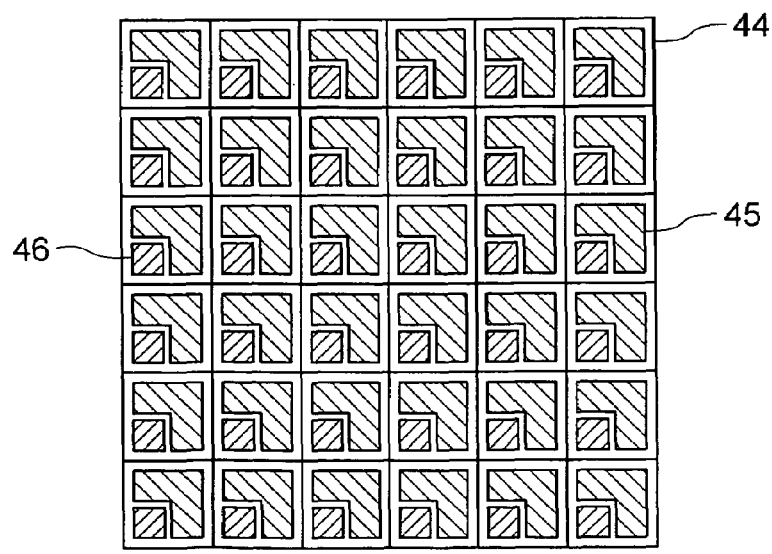
FIG. 14 is a top view showing an electrode pattern arrangement in a conventional light emitting diode element wafer of small area.
Figure 15:
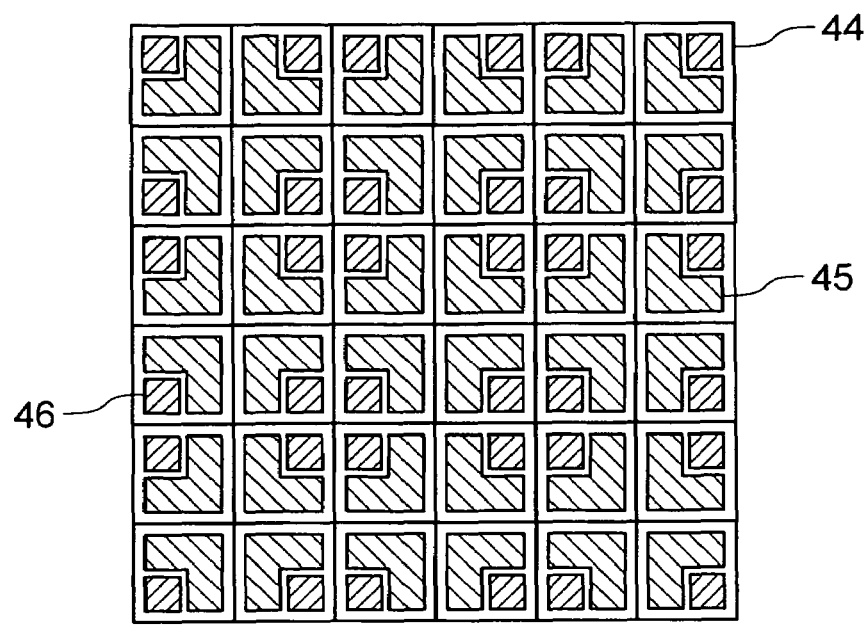
FIG. 15 is a top view showing an electrode pattern arrangement in a light emitting diode unit element wafer according to the present invention.

The electrode structure and pattern in a light emitting diode element structure according to the embodiment of the invention will now be described in greater detail. Illustrated in FIG. 14 is an electrode structure and pattern on a wafer forming light emitting diode unit elements in the prior art and illustrated in FIG. 15 is an electrode structure and pattern on a light emitting diode unit element wafer according to the embodiment of the invention. The minimum constituent unit of each unit element shows an electrode structure and pattern for the small area. In the present embodiment, each electrode pattern in a small area unit element (diode piece) is structured and arranged as shown in FIG. 15. The crystal layer laminations shown in sectional form in FIGS. 9 and 10 exactly hold. In FIG. 15, positive electrodes are arranged intimately and negative electrodes are also arranged intimately to facilitate formation of an electrode arrangement structure, so that the positive electrodes and negative electrodes may respectively be adapted for mergence. When viewed from the center of the group of positive and negative electrodes, it will be seen that the electrode arrangement is point symmetrical. By merging the electrodes as above, mount accuracy, which gives rise to a bottle neck in the unit element of small area in performing the flip chip mounting, can be mitigated. In other words, a highly precise wiring pattern necessary for mounting the small area unit element can be dispensed with and a simplified wiring formation technique such as printing technique can be applied to wiring without resort to the semiconductor process technique and therefore throughput and mounting yield can be improved to advantage. This can be concentrated to module formation at low costs, contributing to a low cost technique capable of forming the backlight module at low costs. The structure as above can be dealt with by merely modifying mask patterns of photolithography and etching in the course of manufacture of individual electrode patterns. Putting the above aside, production can proceeds through quite the same process as that for the prior art, facing no specific difficulties.

Figure 16:
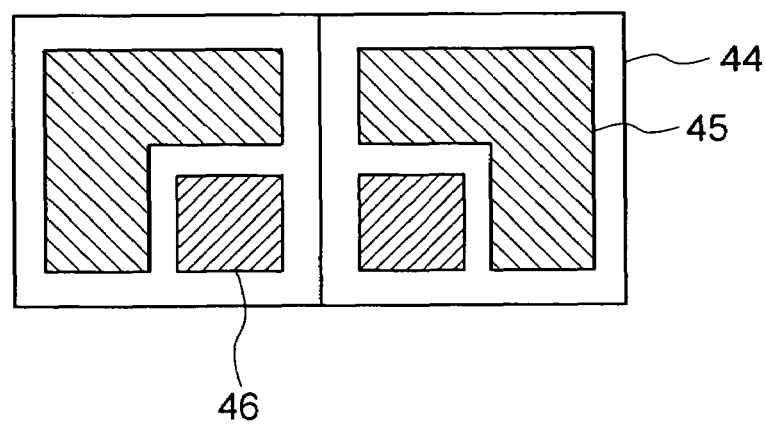
FIG. 16 is a top view showing an electrode pattern arrangement in a light emitting diode element structure of the invention.
Figure 17:
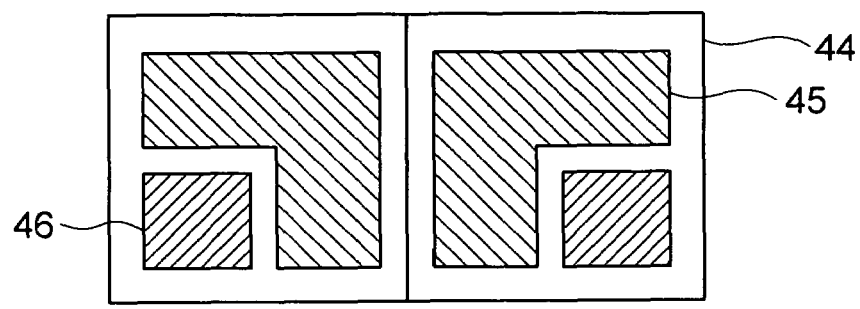
FIG. 17 is a top view showing another electrode pattern arrangement in a light emitting diode element structure of the invention.
Figure 18:
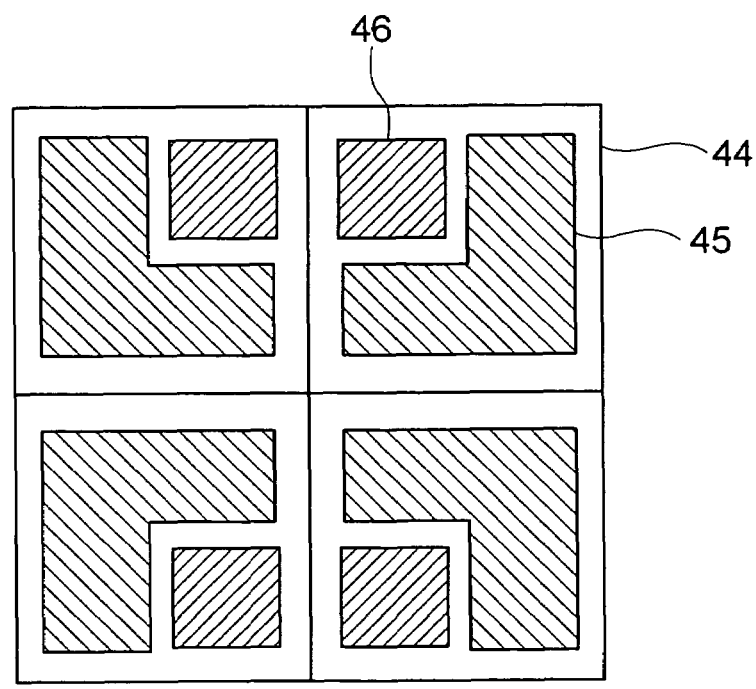
FIG. 18 is a top view showing still another electrode pattern arrangement in a light emitting diode element structure of the invention.
Figure 19:
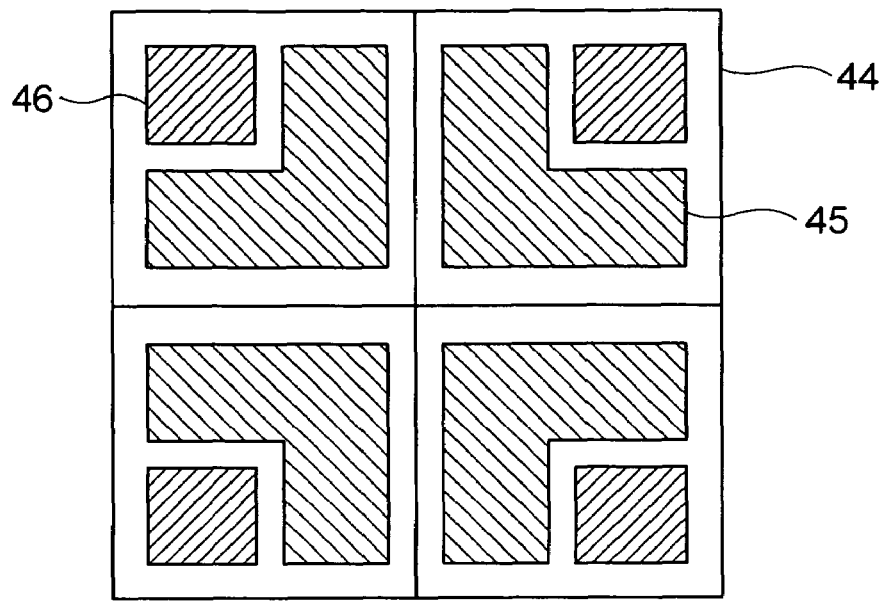
FIG. 19 is a top view showing still another electrode pattern arrangement in a light emitting diode element structure of the invention.
Figure 20:
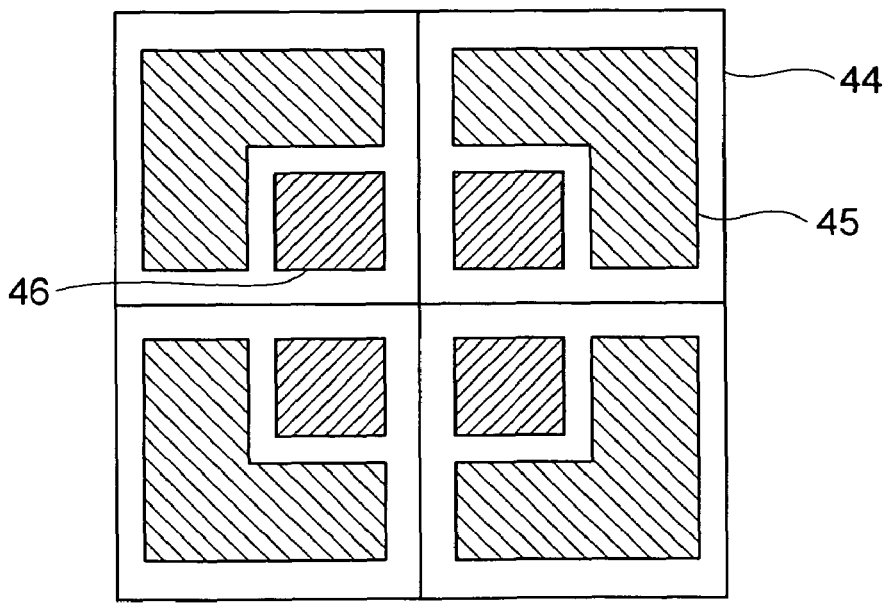
FIG. 20 is a top view showing yet still another electrode pattern arrangement in a light emitting diode element structure of the invention.
Figure 21:
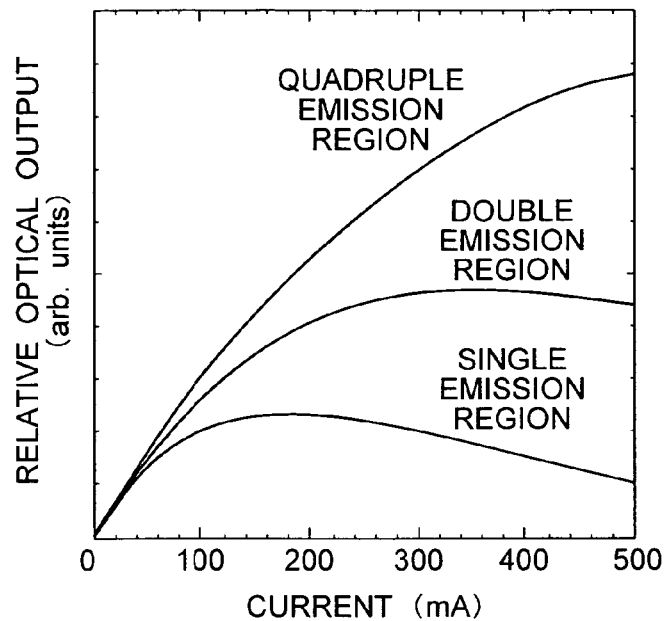
FIG. 21 is a graph showing the relation between relative optical output depending on the area of emission region and current in the light emitting diode element structure.
Figure 22:
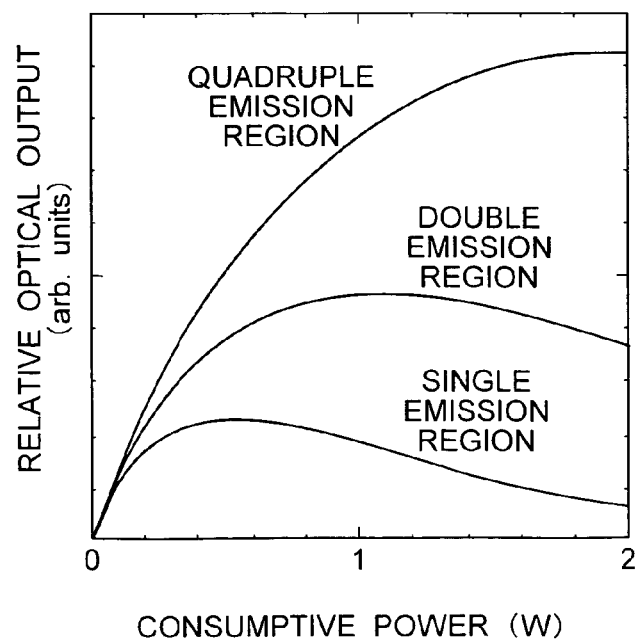
FIG. 22 is a graph showing the relation between relative optical output depending on the area of emission region and consumptive power in the light emitting diode element structure.

When cutting a chip from the wafer having the electrode structure of FIG. 15 subsequently, the chip size can be sorted as will be described below so as to constitute an element structure. In FIG. 16 or 17, an element structure is constructed of two emission regions (corresponding to unit elements) each having a small area and electrodes of the element structures in FIGS. 16 and 17 are arranged differently and can be mounted by the aid of corresponding wiring substrates. In FIG. 18, 19 or 20, an element is constructed of four emission regions each having a small area and electrodes of the element structures in these figures are arranged differently and can be mounted by the aid of corresponding wiring substrates. A relative optical output dependent on current or consumptive power in each of the element structures having two emission regions and four emission regions is examined in relation to that of an element structure having one emission region and corresponding to the conventional small area, thus obtaining calculation results as illustrated in FIG. 21 or 22 to assist in relative comparison of emission efficiencies of the element structures. In FIGS. 21 and 22, it will be appreciated that at a level at which an optical output is saturated in the conventional element having one emission region, optical outputs of the element structures having two and four emission regions, respectively, are not saturated and corresponding operation current and consumptive power can both be reduced to about half or less. For example, for an operation current of 100 mA in the conventional element structure, 70 mA and 63 mA can be attained to obtain the same optical output with the element structures having two emission regions and four emission regions, respectively. Namely, the operation current can advantageously be reduced by 30% and 36% at the respective values. This leads to the reduction effect of consumptive power, proving that swelling of the emission region by using unit elements of small area is an effective method for improving the emission efficiency while maintaining uniformity of current distribution. In addition, the saturation level of optical output can be upgraded and a high output with high brightness can be attained. The rate of mergence effective to advantages of operation current reduction and high output can be emphasized when two emission regions of the conventional element structure are merged, thus providing very effective means and structure.

Figure 23:
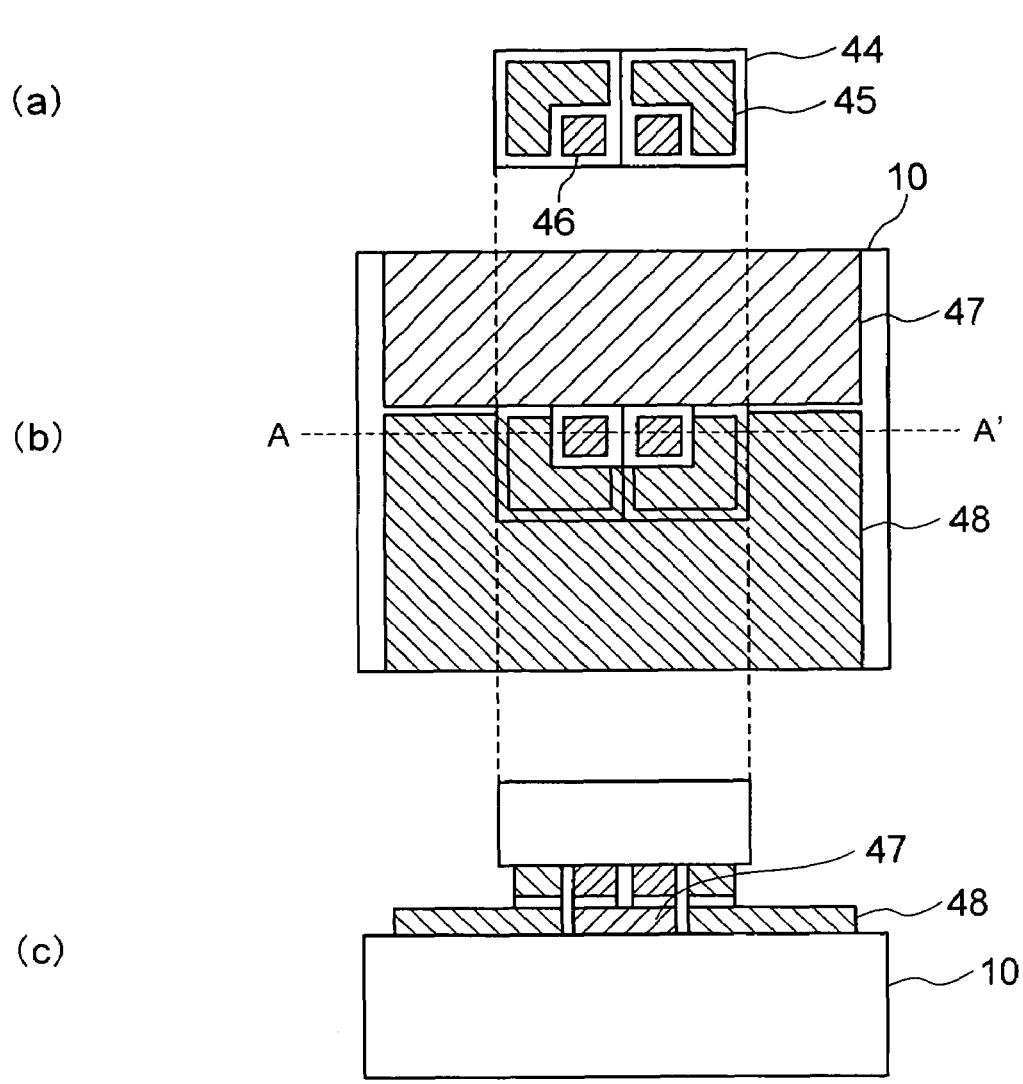
FIG. 23 illustrates at section (a) a top view showing a light emitting diode element structure having an electrode pattern arrangement structure of the invention, at section (b) a top view showing a wiring substrate having a wiring pattern corresponding to the electrode pattern arrangement structure of the invention and a light emitting diode element structure mounted on the wiring substrate and at section (c) a sectional view showing the wiring substrate having a wiring pattern corresponding to the electrode pattern arrangement structure of the invention and the light emitting diode element structure mounted on the wiring substrate.
Figure 24:
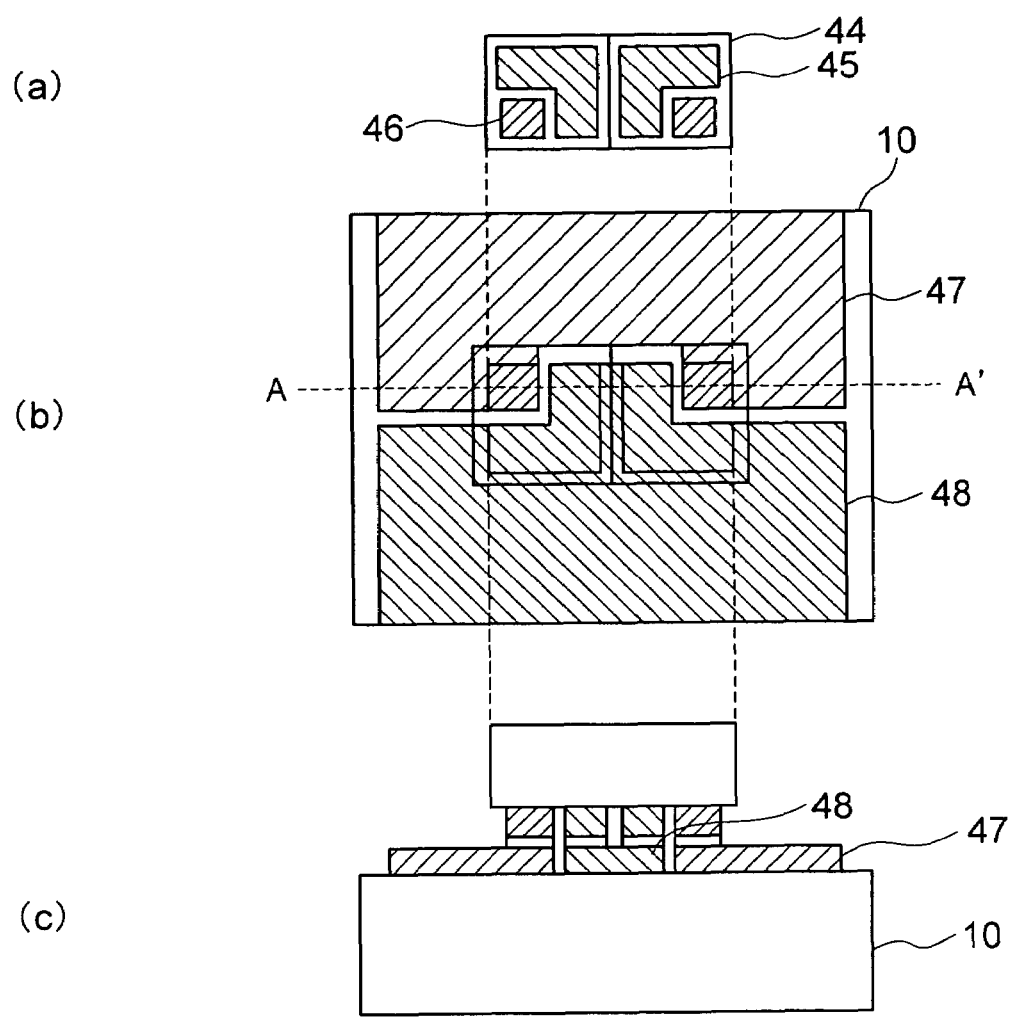
FIG. 24 illustrates at (a) a top view showing a light emitting diode element structure having another electrode pattern arrangement structure of the invention, at (b) a top view showing a wiring substrate having a wiring pattern corresponding to that electrode pattern arrangement structure of the invention and a light emitting diode element structure mounted on the wiring substrate and at (c) a sectional view showing the wiring substrate having a wring pattern corresponding to that electrode pattern arrangement structure of the invention and the light emitting diode element structure mounted on the wiring substrate.
Figure 25:
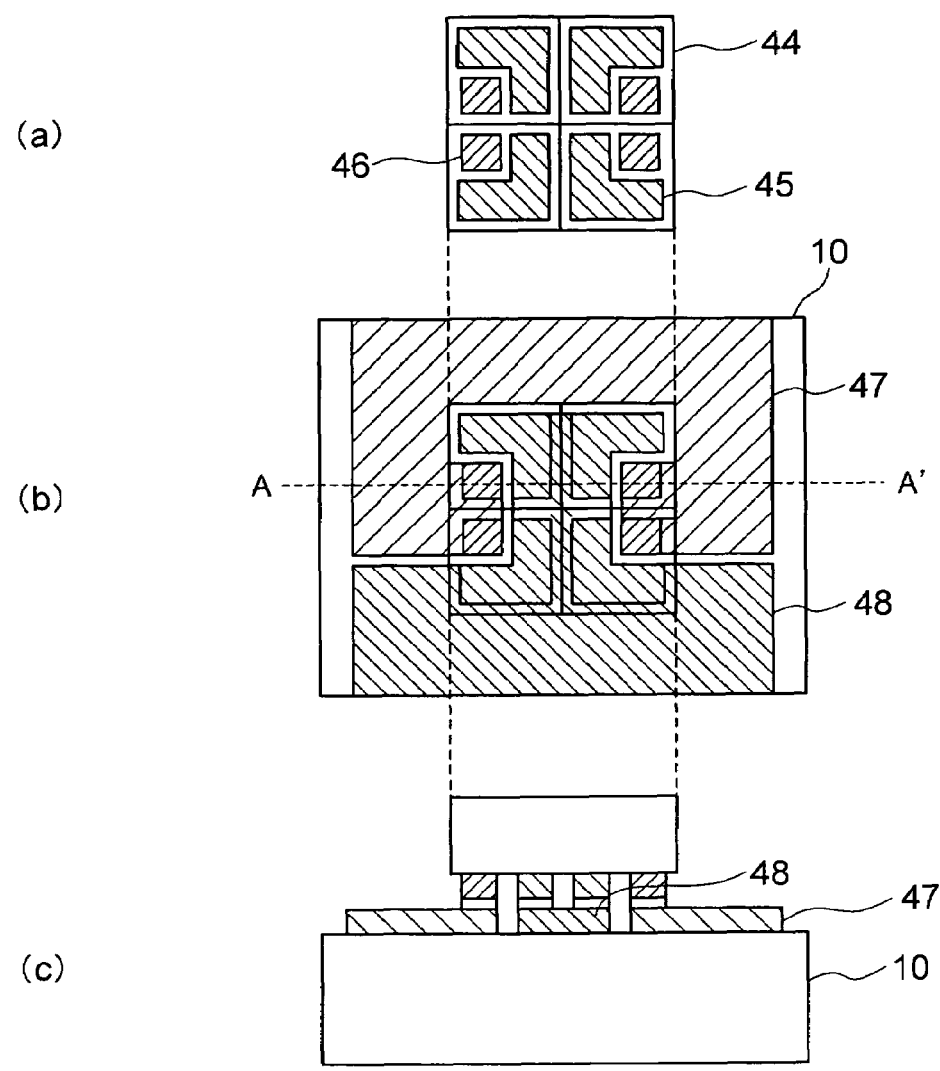
FIG. 25 illustrates at (a) a top view showing a light emitting diode element structure having still another electrode pattern arrangement structure of the invention, at (b) a top view showing a wiring substrate having a wiring pattern corresponding to that electrode pattern arrangement structure of the invention and a light emitting diode element structure mounted on the wiring substrate and at (c) a sectional view showing the wiring substrate having a wring pattern corresponding to that electrode pattern arrangement structure of the invention and the light emitting diode element structure mounted on the wiring substrate.
Figure 26:
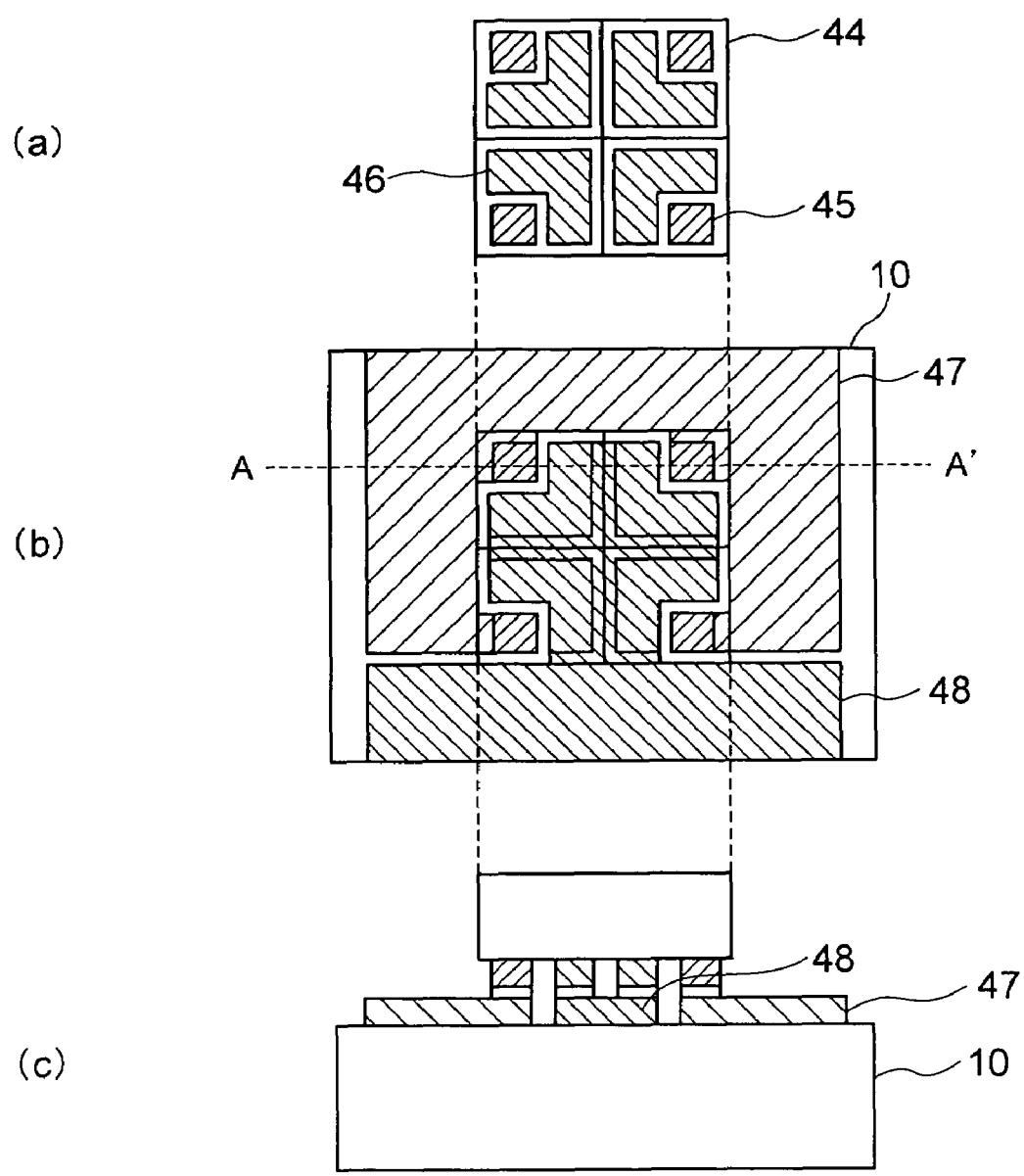
FIG. 26 illustrates at (a) a top view showing a light emitting diode element structure having still another electrode pattern arrangement structure of the invention, at (b) a top view showing a wiring substrate having a wiring pattern corresponding to that electrode pattern arrangement structure of the invention and a light emitting diode element structure mounted on the wiring substrate and at (c) a sectional view showing the wiring substrate having a wring pattern corresponding to that electrode pattern arrangement structure of the invention and the light emitting diode element structure mounted on the wiring substrate.
Figure 27:
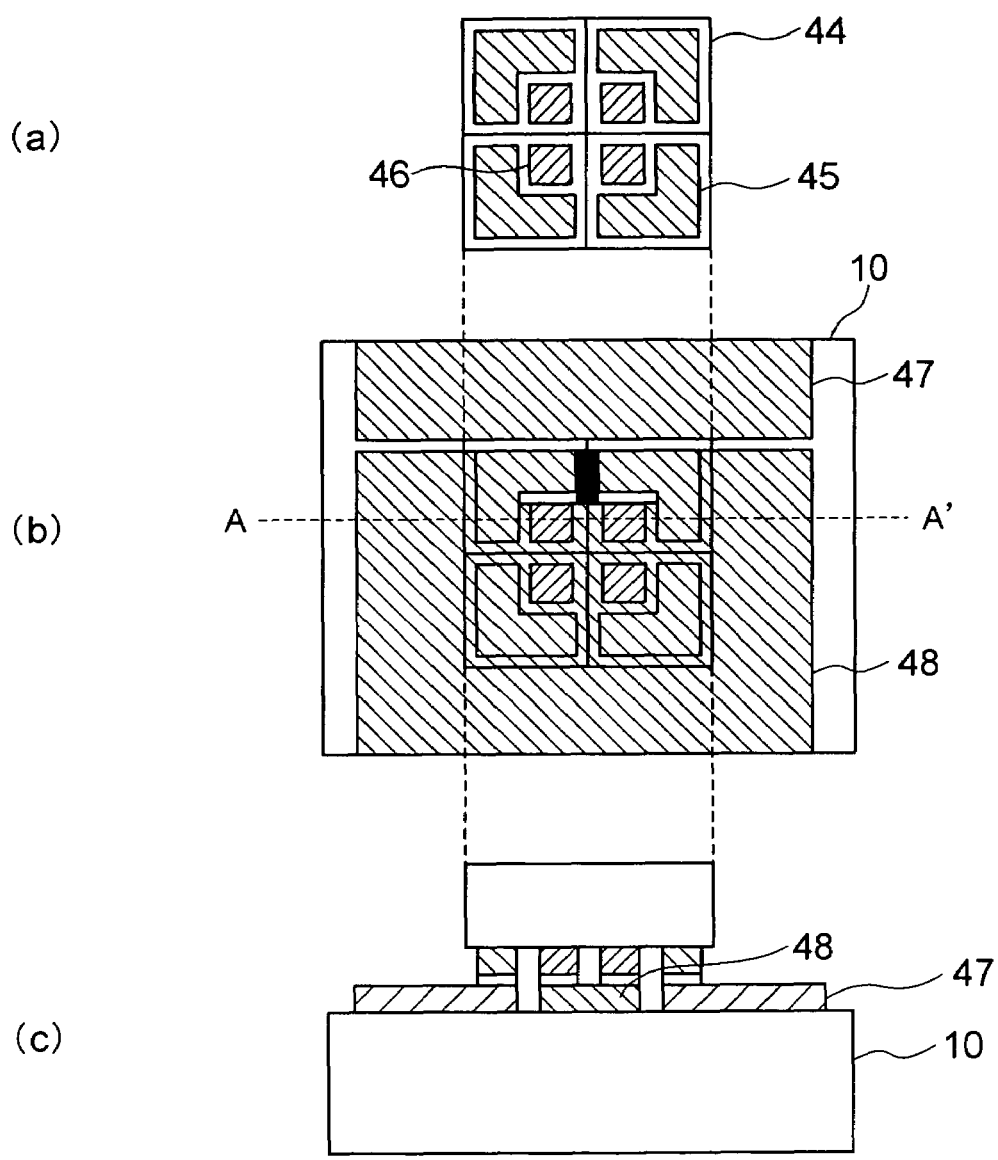
FIG. 27 illustrates at (a) a top view showing a light emitting diode element structure having yet still another electrode pattern arrangement structure of the invention, at (b) a top view showing a wiring substrate having a wiring pattern corresponding to that electrode pattern arrangement structure of the invention and a light emitting diode element structure mounted on the wiring substrate and at (c) a sectional view showing the wiring substrate having a wring pattern corresponding to that electrode pattern arrangement structure of the invention and the light emitting diode element structure mounted on the wiring substrate.
Figure 28:
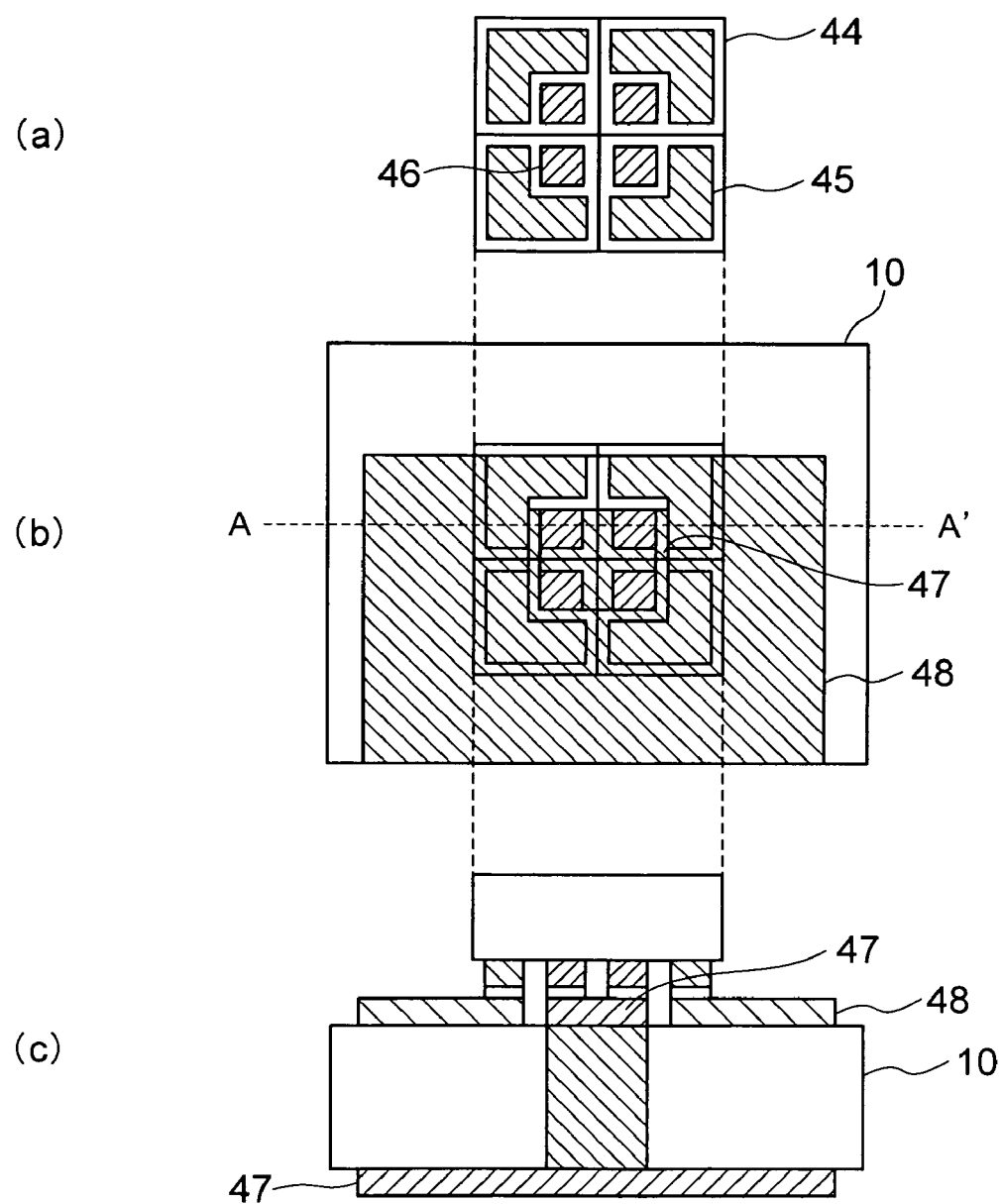
FIG. 28 illustrates at (a) a top view showing a light emitting diode element structure having yet still another electrode pattern arrangement structure of the invention, at (b) a top view showing a wiring substrate having a wiring pattern corresponding to that electrode pattern arrangement structure of the invention and a light emitting diode element structure mounted on the wiring substrate and at (c) a sectional view showing the wiring substrate having a wring pattern corresponding to that electrode pattern arrangement structure of the invention and the light emitting diode element structure mounted on the wiring substrate.

A mounting form adopted when the individual element structures are applied with flip chip mounting in the present embodiment will be described. Wiring substrates and flip chip mounting forms in element structures having each two emission regions are illustrated in FIGS. 23 and 24 and wiring substrates and flip chip mounting forms in element structures having each four emission regions are illustrated in FIGS. 25 and 26 and FIGS. 27 and 28 as well. Each element structure is flip-chip mounted while confronting a negative electrode wire 47 and a positive electrode wire 48. In this phase, the substrate wiring has a pattern width within a range in which its formation by printing technique is possible and the flip chip mounting can be dealt with easily. Further, bumps are formed on the side of electrode of the element structure and therefore, the mounting accuracy can be allowed to have a tolerance to make it possible to improve the throughput and mounting yield. For example, even when structuring an isolated pattern of electrode for which mounting is difficult, the negative electrodes 46 of an element structure can be merged to have a relatively large area as shown in FIG. 27 and hence a region at which flip chip mounting is effected can correspond to a wire to permit the wire to be laid on the top surface of the substrate and besides, as shown in FIG. 28, a via-hole can be bored in the substrate and a wire confronting the negative electrode can be laid on the back of the substrate. For these reasons, variations and mounting tolerance can be permitted in handling chip flip mounting and besides the wire to the electrode can be laid vertically to the substrate surface, thereby effectively contributing to heat dissipation to the substrate and housing.

Figure 29A:
FIG. 29A is a circuit diagram showing that four light emitting diode unit elements each having one diode are connected in series.
Figure 29B:
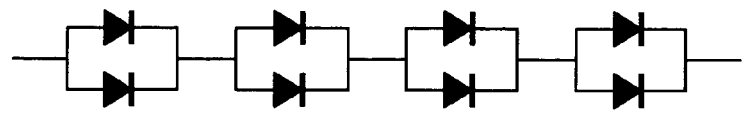
FIG. 29B is a circuit diagram showing that four sets of light emitting diode unit elements each having two diodes connected in parallel are connected in series.
Figure 29C:
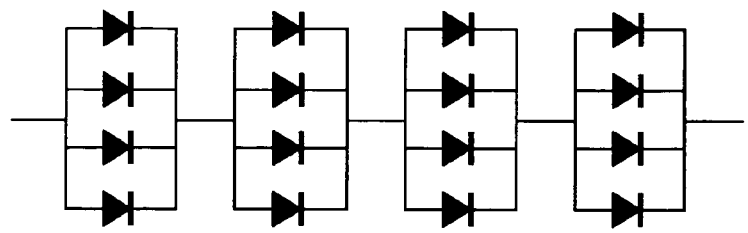
FIG. 29C is a circuit diagram showing that four sets of light emitting diode unit elements each having four diodes connected in parallel are connected in series.
Figure 30:
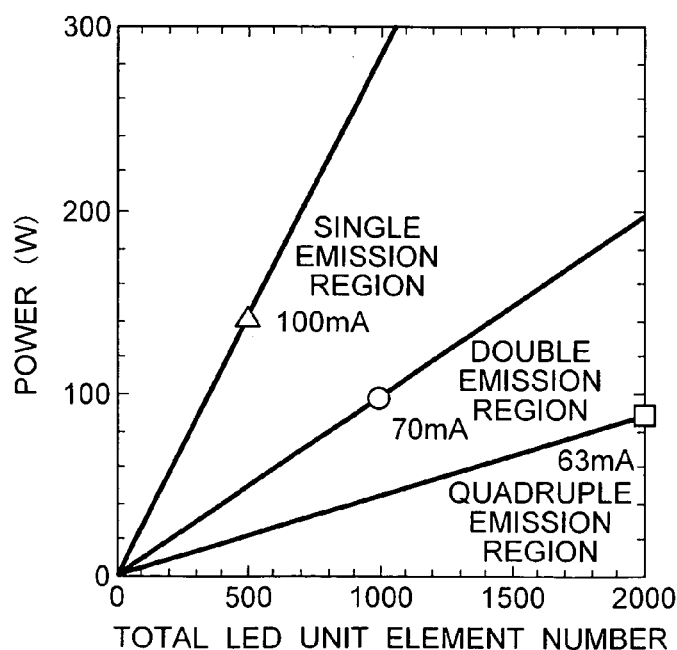
FIG. 30 is a graph showing the relation between consumptive power of a backlight module using a light emitting diode element structure, which consumptive power depends on the emission region, and total number of unit elements of small area.

The aforementioned conventional element structure and the element structure having a wide emission region will be considered in terms of equivalent circuits of light emitting diode unit elements constituting the unit structure shown in FIGS. 4 and 5. When individual unit elements or unit structures in FIG. 4 or 5 are connected in series for operation, equivalent circuits of diodes are set up as shown in FIGS. 29A to 29C. In the conventional element shown in FIG. 29A, four unit elements are connected in series whereas in the case of element structures having two emission regions (corresponding to unit elements) and four emission regions, respectively, equivalent circuits corresponding to FIGS. 29B and 29C are set up, respectively. In FIGS. 29A to 29C, when the respective unit structures are operated with the same constant current, currents flowing through individual emission regions correspond to ½ and ¼ in the case of the elements having two emission regions and four emission regions, respectively. This accounts for the fact that lower current is applied to one emission region and the emission efficiency can be improved relatively. This advantage has already been described in connection with FIGS. 21 and 22. But since the emission region swells, thus leading to an effective increase in the number of unit elements, the effect from the standpoint of the effective increase in the number of unit elements will be described. In FIG. 30, abscissa represents the effective number of unit elements in terms of the area of conventional unit element and ordinate represents consumptive power, showing results of calculation at solid line. In case an average operation current is 100 mA when a backlight module is structured by using, for example, 500 conventional unit elements, the operation current is 70 mA for an element structure having two light emission regions and 63 mA for an element structure having four light emission regions by taking into account improvements in emission efficiency. This corresponds to an about 30% reduction in consumptive power in the case of the element structure having two light emission regions and an about 40% reduction in consumptive power in the case of the element structure having four emission regions. As will be seen from the above, in the element structure having two emission regions or the element structure having four emission regions, the operation current and consumptive power can be deemed as being reduced by increasing the effective number of unit elements to swell the element structure size and as compared to the enlargement of element structure size based on total change of the element structure and electrode structure as in the case of FIG. 12, high emission efficiency can be maintained and the element structure size as small as necessary can suffice to advantage. Further, the mounting accuracy can be mitigated and the throughput and yield can be improved, thus providing an excellent technique capable of stabilizing the electrical characteristics and improving the heat dissipation characteristics so that an excellent technique for assuring the compatibility between performance improvement and low cost may be provided. In the case of the element structure having two emission regions or the element structure having four emission regions in FIG. 30, the emission efficiency can be promoted and low current operation can be assured to advantage and the effective number of unit elements can be reduced adaptively by optimizing the location and arrangement of unit elements through optical design, demonstrating that the embodiment of the invention can be effective to the technique for unit element number reduction and cost reduction.

The light emitting diode element structure and mounting form according to the present embodiment can be applied to not only the liquid crystal panel display apparatus for small-size and large-size televisions but also a backlight light source of a liquid crystal panel for personal computer and that of a car navigation device as well.

Embodiment 2

Figure 31A:
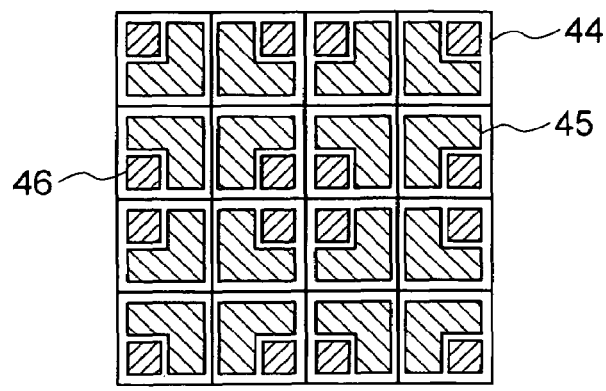
FIG. 31A is a top view showing another electrode pattern arrangement of a light emitting diode element structure of large area according to the present invention.
Figure 31B:
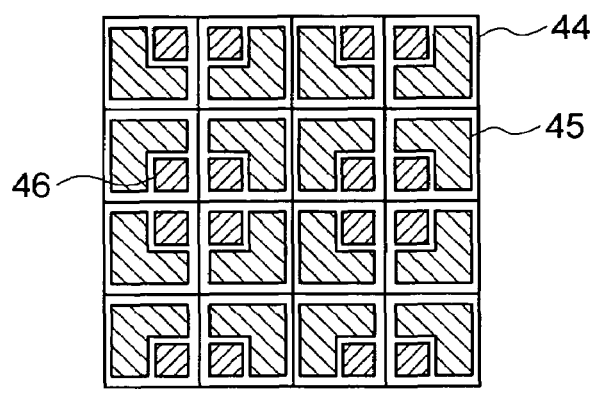
FIG. 31B is a top view showing still another electrode pattern arrangement of a light emitting diode element structure of large area according to the present invention.
Figure 31C:
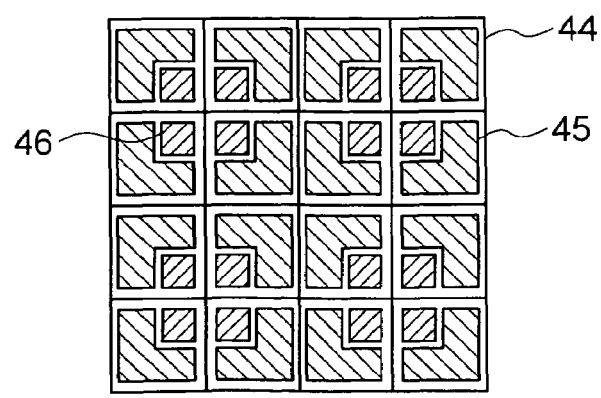
FIG. 31C is a top view showing yet another electrode pattern arrangement of a light emitting diode element structure of large area according to the present invention.

A second embodiment of the present invention will now be described with reference to FIGS. 31A to 31C. As in embodiment 1, the shape cut out of the light emitting diode element wafer can be arbitrary. The wiring substrate can be applied by making it commensurate with the electrode pattern structure of a cutout light emitting diode element structure. For example, as shown in FIGS. 31A to 31C, a light emitting diode element structure of large area can be set up by increasing the period of cut-out from the light emitting diode element wafer. It is not necessary for the electrode structure and process steps to be specifically changed to meet a large element structure. In other words, by making the electrode structure and process step commensurate with the unit element of small area, element structures having small to large areas can be produced from the same wafer. Element structures of small size and large size can be used selectively in accordance with different applications. The element size obtained from the same wafer can deal with and cultivate applications.

Figure 32A:
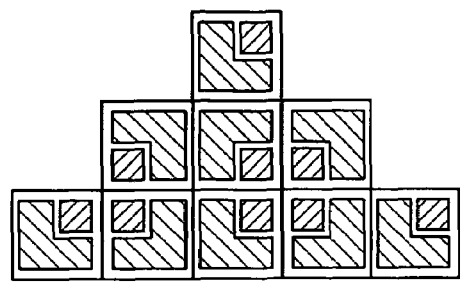
FIG. 32A is a top view showing an electrode pattern arrangement of a light emitting diode element structure of another shape.
Figure 32B:
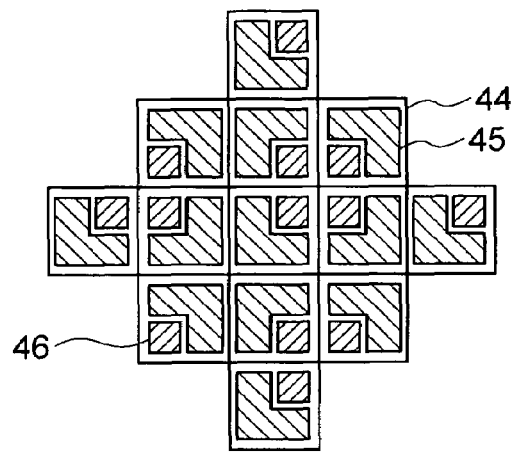
FIG. 32B is a top view showing an electrode pattern arrangement of a light emitting diode element structure of still another shape.
Figure 32C:
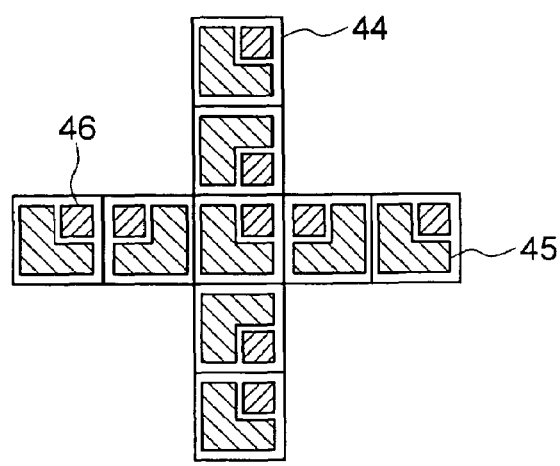
FIG. 32C is a top view showing an electrode pattern arrangement of a light emitting diode element structure of yet another shape.

Further, as shown in FIGS. 32A to 32C, the shape cut out of the light emitting diode element wafer can analogously be triangular, rhombic or crucible. Accordingly, the shape can comply with a new application and can be dealt correspondingly. The element structure shape from the same wafer can deal with and cultivate applications.

The light emitting diode element structure and mounting form according to the present embodiment can be applied to not only the normal liquid crystal panel display apparatus but also a new display apparatus for use in letters and monitoring.

Embodiment 3

A third embodiment of the invention will be described with reference to FIGS. 33 to 39.

Figure 33:
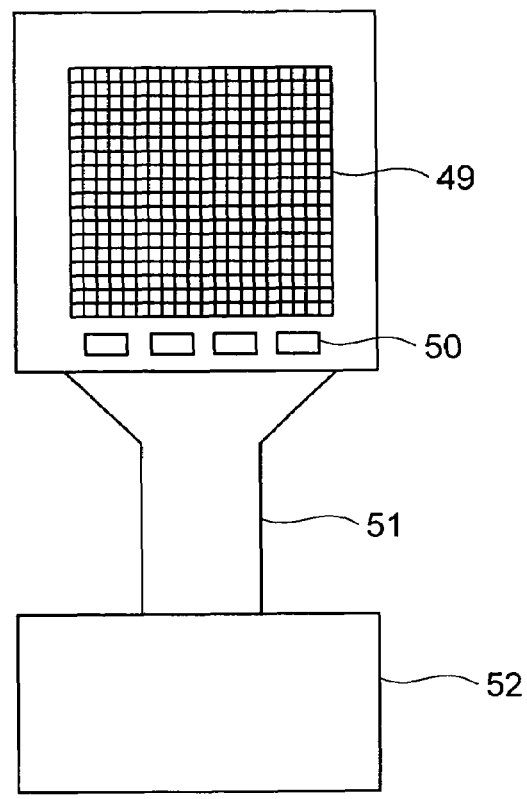
FIG. 33 is a top view of a liquid crystal panel display apparatus for cell phone using a light emitting diode element backlight module according to the present invention.
Figure 34:
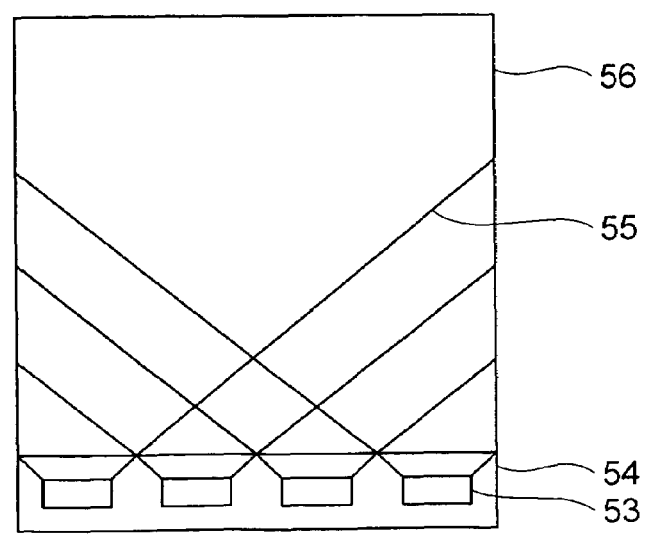
FIG. 34 is a top view of the light emitting diode element backlight module of the invention.
Figure 35:
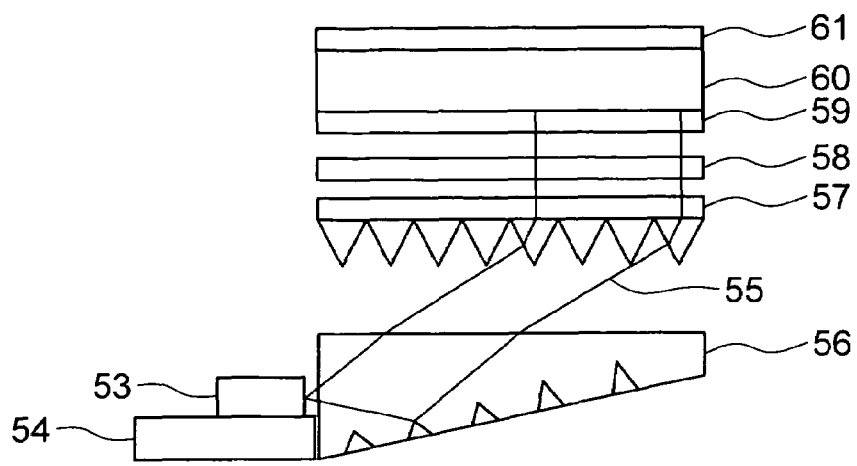
FIG. 35 is a sectional view of the liquid crystal panel display apparatus for cell phone using the light emitting diode element backlight module of the invention.
Figure 36:
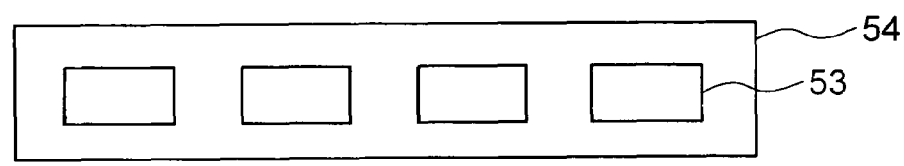
FIG. 36 is a top view showing a different unit element structure on which the light emitting diode unit elements of the invention are mounted.
Figure 37:
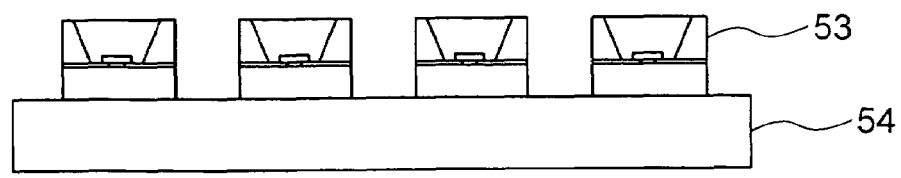
FIG. 37 is a sectional view showing the different unit element structure on which the light emitting diode unit elements of the invention are mounted.
Figure 38:
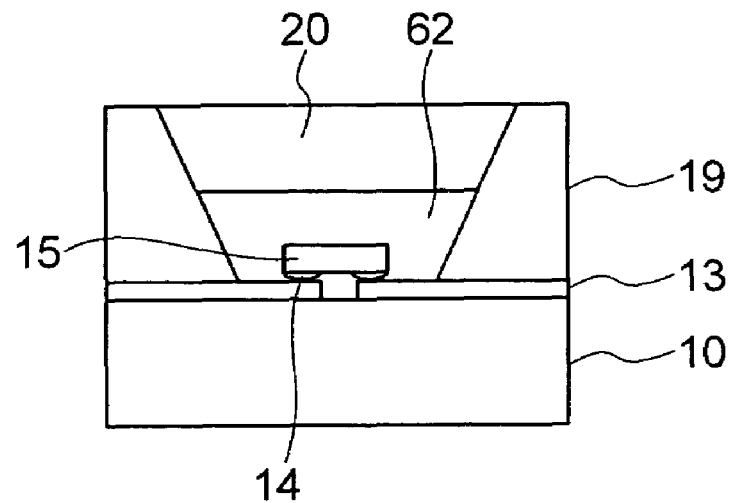
FIG. 38 is a sectional view showing another cell package on which a light emitting diode unit element of the invention is mounted.
Figure 39:
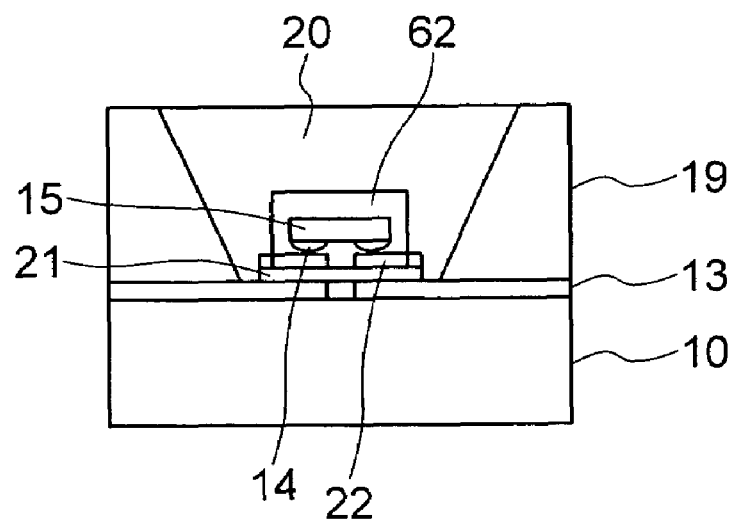
FIG. 39 is a sectional view showing still another cell package on which a light emitting diode unit element of the invention is mounted.

In the present embodiment, a backlight source constituting a liquid crystal panel display apparatus for cell phone is formed. A light emitting diode element structure applied to the backlight source essentially presupposes that the electrode pattern of element structure is constructed and flip chip mounting is performed as has been explained in connection with embodiment 1. The liquid crystal panel display apparatus for cell phone is constructed as illustrated in FIG. 33. In association with liquid crystal panel pixels 49, a backlight module having, as a light source, light emitting diode unit elements 50 of the invention is structured and the backlight is operated through film wire 51 and drive circuit 52. Illustrated in FIGS. 34 and 35 is a constitution in which light emitting diode unit element packages 53 of the invention are carried on a wire and film 54 and the liquid crystal panel display apparatus is illuminated with rays 55 of backlight through a light guide plate 56. The liquid crystal panel display apparatus for cell phone is constructed such that backlight rays 55 transmit through an inverse prism sheet 57, a diffusion film 58, a lower polarization plate 59, a thin-film transistor for cell phone and liquid crystal panel 60 and an upper polarization plate 61. A light emitting diode unit structure in the present embodiment is constructed as shown in top view form in FIG. 36 and in sectional form in FIG. 37. A cell package of light emitting diode unit structure is constructed as illustrated in FIG. 38 or 39. The structure of cell package is similar to that of embodiment 1 shown in FIGS. 7 and 8 but a blue light emitting diode piece is added with resin 62 containing a fluorescent substance such as yellow phosphors. Through this, a white light emitting diode piece can be constructed. Alternatively, as the light emitting diode unit element, light emitting diode pieces of three primary colors of blue, green and red may be mounted to provide a structure similar to that of embodiment 1. As explained in connection with embodiment 1, by using resin of high refractive index or resin mixed with fine particles of high refractive index in the transparent resin for sealing the unit element, the efficiency of taking out light from each diode piece can be improved. This can improve the external quantum efficiency of the diode piece to advantage.

In the present embodiment, too, advantages similar to those explained in connection with embodiment 1 can be found. Namely, from the standpoint of improvements in performance, the operation current and consumptive power can be reduced by improving the emission efficiency of the element structure. Further, since the throughput and yield can be upgraded by mitigating the mounting precision, stability of electrical characteristics and improvements in heat dissipation characteristics can be attained, thus providing a technique capable of assuring the compatibility between performance improvement and low costs. Further, by optimizing the location and arrangement of unit elements through optical design, the effective number of unit elements can be reduced to advantage and a technique for reduction of unit element number and cost reduction can advantageously be envisaged.

The light emitting diode element structure and mounting form according to the present embodiment can be applied to not only the liquid crystal panel display apparatus for cell phone but also a backlight light source of a display unit of information/communication apparatus and that of a small-size and super small-size display apparatus as well.

Embodiment 4

Figure 40:
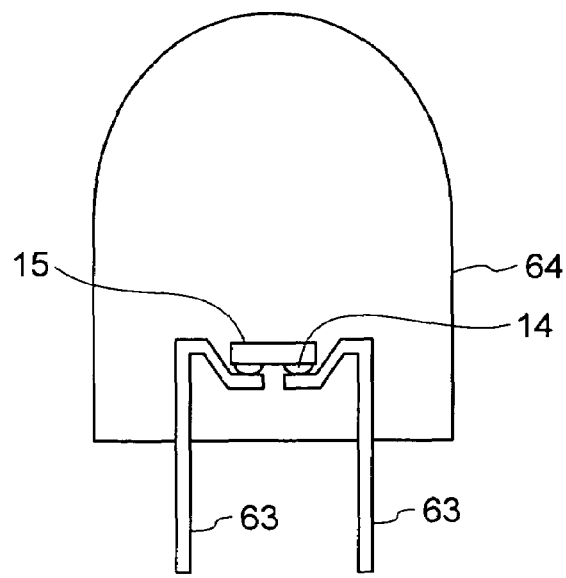
FIG. 40 is a sectional view showing a bullet type package on which a light emitting diode unit element of the invention is mounted.

A fourth embodiment of the present invention will now be described with reference to FIG. 40.

A bullet type light emitting diode cell package has been used in prior arts and in the present embodiment, this type of cell package will be constructed. Essentially, the light emitting diode element structure applied to the backlight source presupposes that the electrode pattern of element structure is formed and the flip chip mounting is performed as explained in connection with embodiment 1. In the bullet type cell package, a cup-shaped reflection plate for reflecting an emission component emitted from a unit element located at lead frames 63 is formed, the unit element is flip-chip mounted to the opposing arms of lead frame and thereafter transparent resin 64 is formed into a bullet type shape by using a metal mold. The unit element can be constructed of a white light emitting diode piece or alternatively, light emitting diode pieces of three primary colors of blue, green and red may be mounted to form the unit element. As has been explained in connection with embodiment 1, by using a resin substance of high refractive index or resin mixed with fine particles of high refractive index as the transparent resin for sealing the pieces, the efficiency of light taken out of each piece can be improved. Through this, the external quantum efficiency of the piece can be improved to advantage.

In the present embodiment, too, advantages similar to those explained in connection with embodiment 1 can be found. Namely, from the standpoint of improvements in performance, the operation current and consumptive power can be reduced by improving the emission efficiency of the unit element. Further, since the throughput and yielding can be improved by mitigating the mounting precision, stability of electrical characteristics and improvements in heat dissipation characteristics can be attained, thus providing a technique capable of assuring the compatibility between performance improvement and low cost. Further, by optimizing the location and arrangement of unit elements through optical design, the effective number of unit elements can be reduced to advantage and a technique for unit element number reduction and low cost can advantageously be envisaged.

In the present embodiment, a small-sized bullet type light emitting diode unit element can be produced by sealing light emitting diode pieces of three primary colors of blue, green and red or light emitting diode pieces of three primary colors of blue, green, green and red with the same bullet type transparent resin, and many bullet type light emitting diode element cell packages can be integrated to provide a large-screen display apparatus having direct light source pixels.

The light emitting diode element structure and the mounting form according to the present embodiment can be applied to not only a display apparatus for letters, marks and signboard but also a display unit of information communication apparatus and a display apparatus for use in a large-sized or super-large-sized television in which the light emitting diodes of the present embodiment are integrated as direct light source pixels.

Embodiment 5

A fifth embodiment of the invention will be described with reference to FIGS. 41 to 67.

Figure 41:
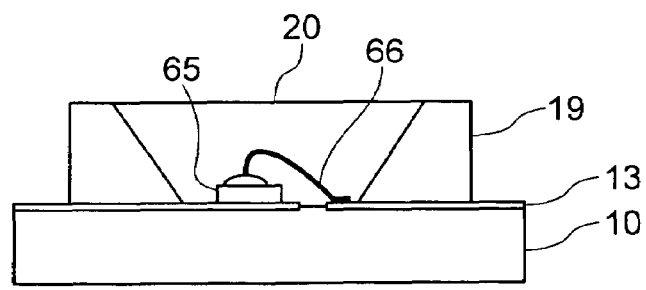
FIG. 41 is a sectional view showing a cell package carrying a one-wire mount type light emitting diode unit element of the invention.

The present embodiment is the same as embodiments 1 to 4 with only exception that the light emitting diode element structure is wire-bonding mounted and constructed correspondingly. A cell package of the present embodiment in which an LED unit element is wire-mounted is illustrated in sectional form in FIG. 41 or 42. The package structure is identical to that shown in embodiment 1 but when the LED unit element is formed on a conductive type substrate so that electrical conduction can be made in up and down directions of the unit element, mounting is performed by one Au wire 66 to set up connection to a wiring substrate as shown in FIG. 41. When the substrate of LED unit element is non-conductive type, wire-bond mounting is performed using two Au wires 66 so as to permit only the upper side of the LED unit element to be in conduction.

Figure 42:
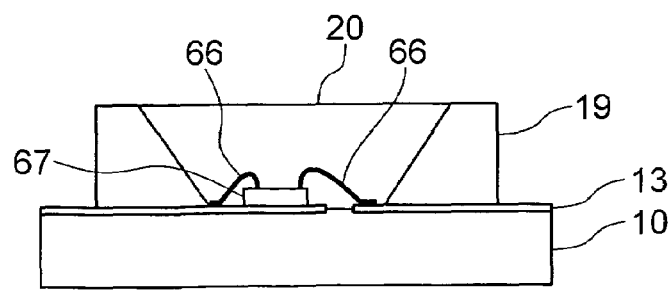
FIG. 42 is a sectional view showing a cell package carrying a two-wire polarity corresponding mount type light emitting diode unit element of the invention.
Figure 43:
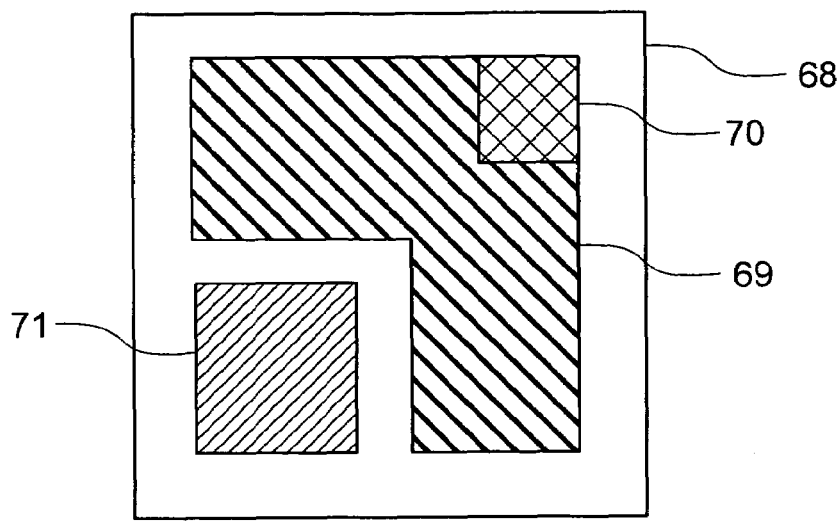
FIG. 43 is a top view showing an example of an electrode pattern in a conventional two-wire polarity corresponding mount type light emitting diode element structure.
Figure 44:
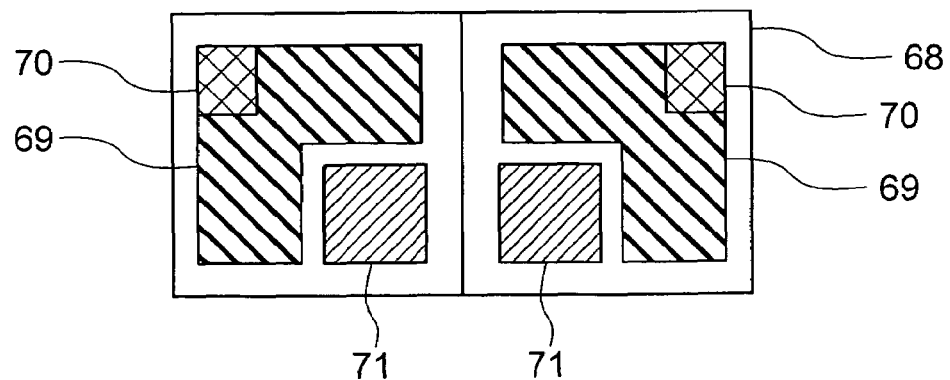
FIG. 44 is a top view showing an electrode pattern in a two-wire polarity corresponding mount type light emitting diode element structure according to the present invention.

In the following description, the present embodiment will be described by using the two-wire mounting type LED unit element shown in FIG. 42. Referring to FIG. 43, there is illustrated a prior art electrode pattern and unit element structure for which wire-bond mounting using two wires is performed. Contrary thereto, an LED unit element structure and electrode pattern for which mounting corresponding to respective polarities is performed by two wires according to the present embodiment is illustrated in FIG. 44. A semiconductor layer as illustrated is provided on a substrate 68 of LED unit element, a transparent electrode 69 and a positive electrode 70 are formed and thereafter, following lithography and etching process, a negative electrode 71 is formed. In FIG. 44, the electrode arrangements in two of conventional LED element structures of FIG. 43 are used in such a manner that the right and left side ones are mutually exchanged axisymmetrically and formed on the same substrate 68. In the respective left and right side regions, one pair of positive and negative electrodes is provided, with the respective unit elements being electrically isolated from each other. Namely, emission layer portions provided in the left and right side regions, respectively, are separated by an isolation groove and the electrodes for electrically conducting and driving these emission layer portions are also separated electrically. In this unit element, the individual positive electrodes 70 are mounted to the wiring substrate by wire bonding and the individual negative electrodes 71 are mounted to the wiring substrate by wire bonding. The respective positive electrodes 70 are wire-bonding mounted to one corresponding wire and the respective negative electrodes 71 are also wire-bonding mounted to one corresponding wire, with the result that the unit elements or diode pieces are connected in the form of a parallel circuit and operated in parallel. Accordingly, each of the left and right side emission layer portions can be operated by being supplied with half the current in the conventional element structure of FIG. 43 under the application of the same voltage. Consequently, drive can proceed at about half level in terms of power. As for the emission output, the emission region is doubled in area and hence the quantity of light, which is twice or more, can be obtained to promote the intensity correspondingly. Namely, in the unit element structure of FIG. 44, the emission efficiency can be upgraded under application of the same voltage. Within a range in which the emission efficiency does not decrease, a plurality of emission layer portions can be integrated or the emission layer can be divided into plural regions on the same substrate in expectation of improved emission efficiency based on parallel drive.

Figure 45:
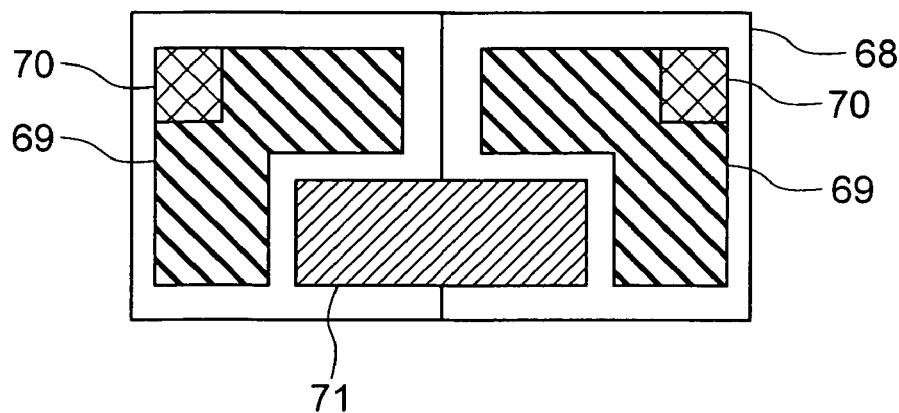
FIG. 45 is a top view showing another electrode pattern in the two-wire polarity corresponding mount type light emitting diode element structure of the invention.
Figure 46:
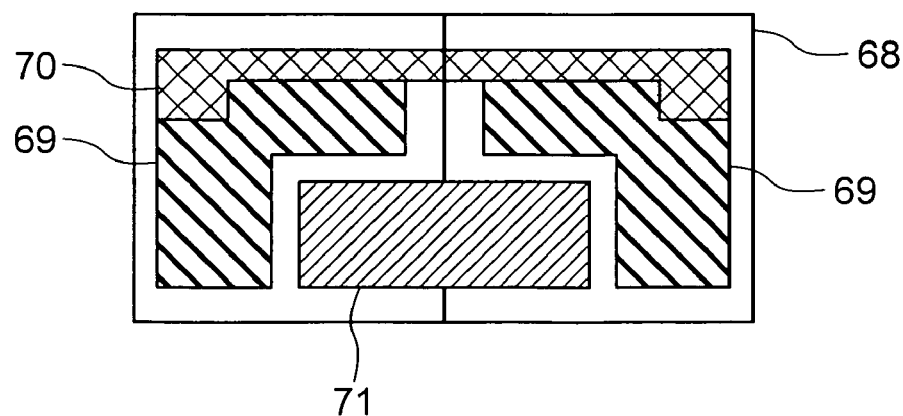
FIG. 46 is a top view showing still another electrode pattern in the two-wire polarity corresponding mount type light emitting diode element structure of the invention.

Conceivably, from the standpoint of unit element structure mounting, wire bonding can be simplified. Referring to FIG. 45, the negative electrodes 71 in the LED structure of FIG. 44 are merged, so that mounting can be performed using one wire to be connected to a resultant negative electrode. Further, in FIG. 46, counterparts of the positive electrode 70 and those of negative electrode 71 in the LED unit elements of FIG. 44 are merged, respectively, thus permitting one wire to be connected to each of the resultant positive and negative electrodes for mounting.

Figure 47:
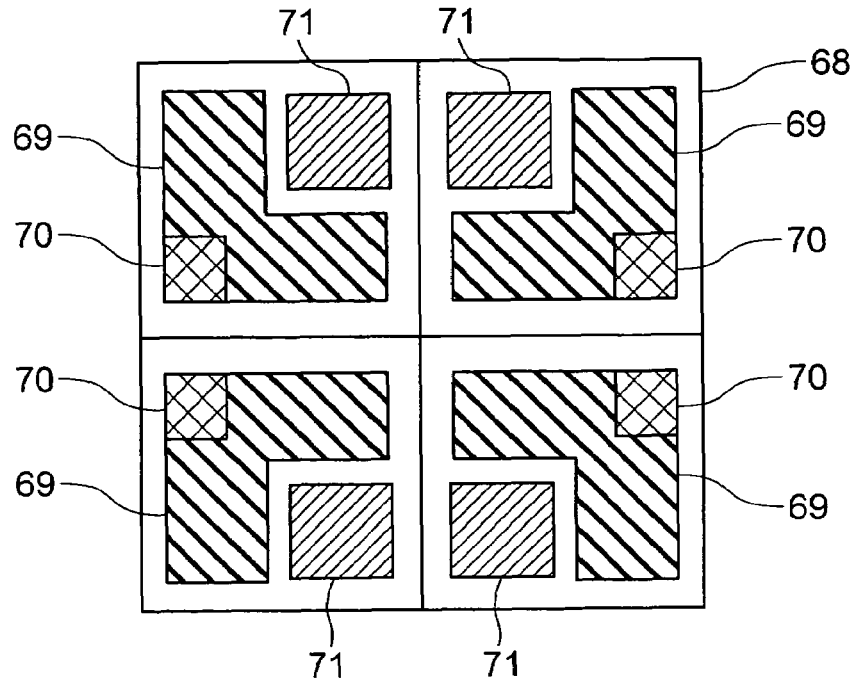
FIG. 47 is a top view showing still another electrode pattern in the two-wire polarity corresponding mount type light emitting diode element structure of the invention.
Figure 48:
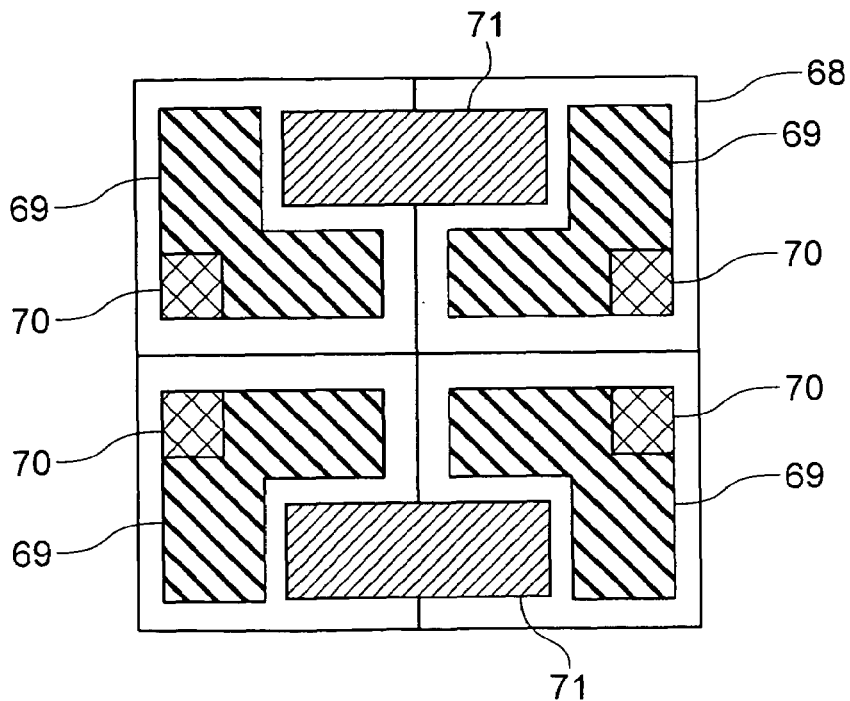
FIG. 48 is a top view showing still another electrode pattern in the two-wire polarity corresponding mount type light emitting diode element structure of the invention.
Figure 49:
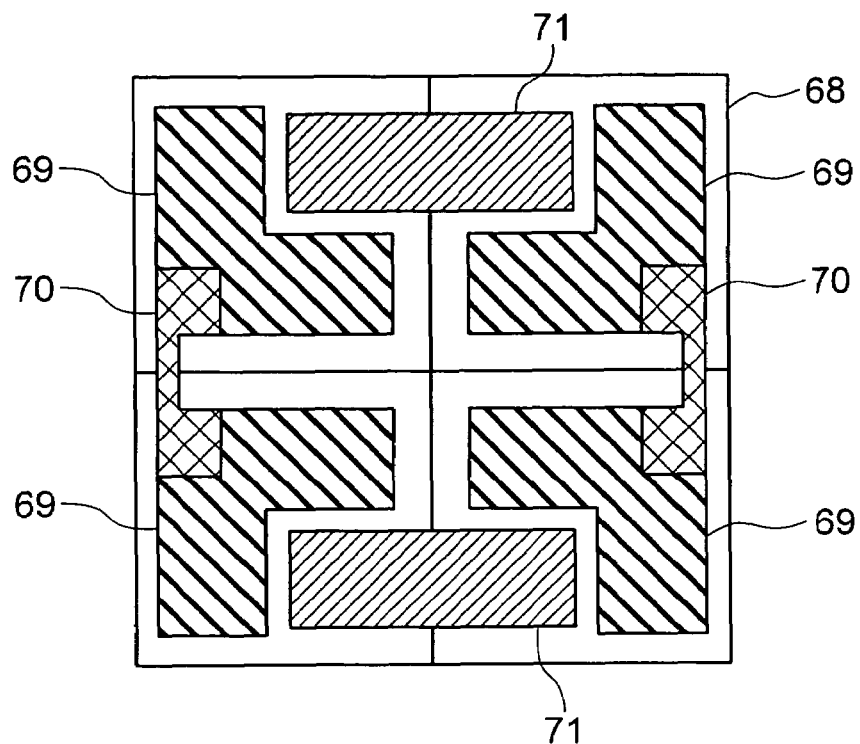
FIG. 49 is a top view showing still another electrode pattern in the two-wire polarity corresponding mount type light emitting diode element structure of the invention.
Figure 50:
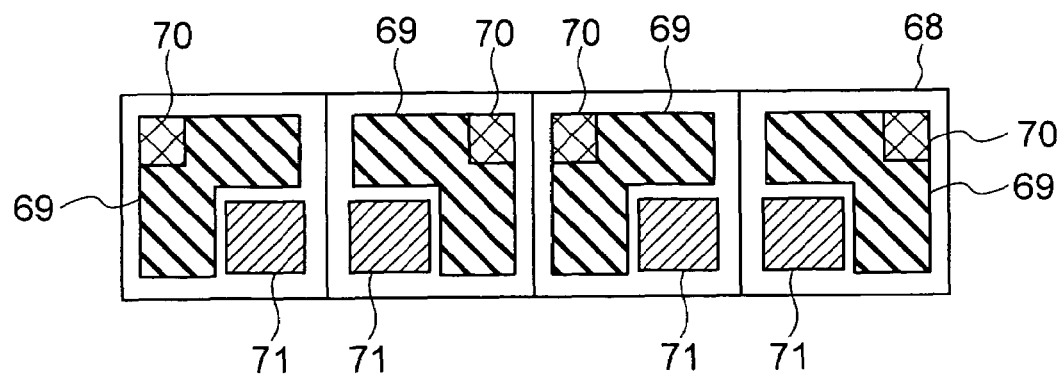
FIG. 50 is a top view showing still another electrode pattern in the two-wire polarity corresponding mount type light emitting diode element structure of the invention.
Figure 51:
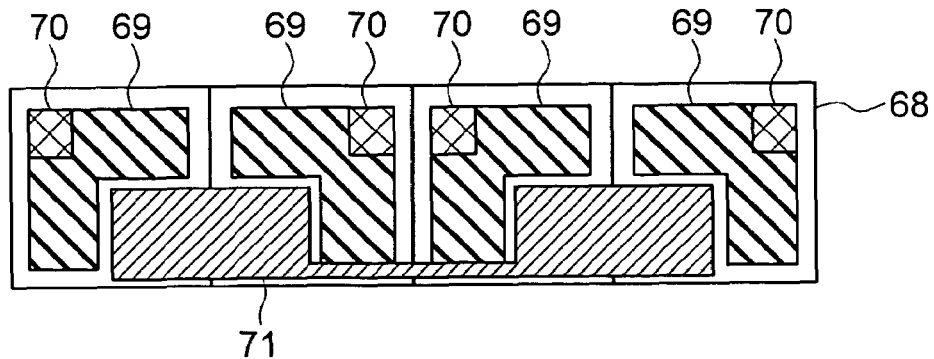
FIG. 51 is a top view showing still another electrode pattern in the two-wire polarity corresponding mount type light emitting diode element structure of the invention.
Figure 52:
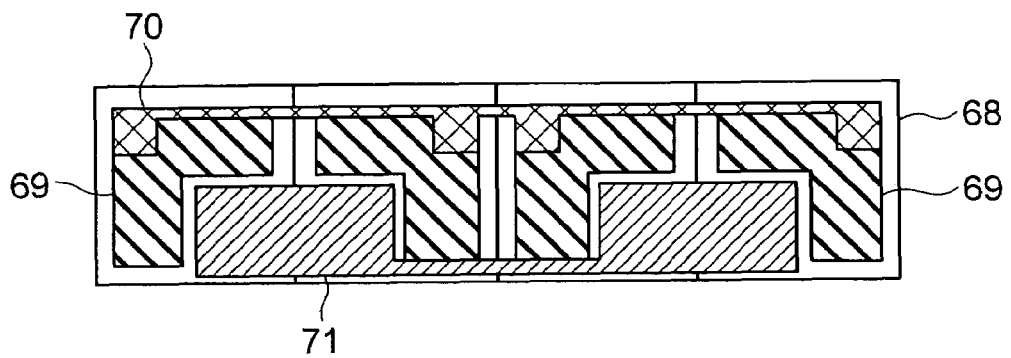
FIG. 52 is a top view showing still another electrode pattern in the two-wire polarity corresponding mount type light emitting diode element structure of the invention.
Figure 53:
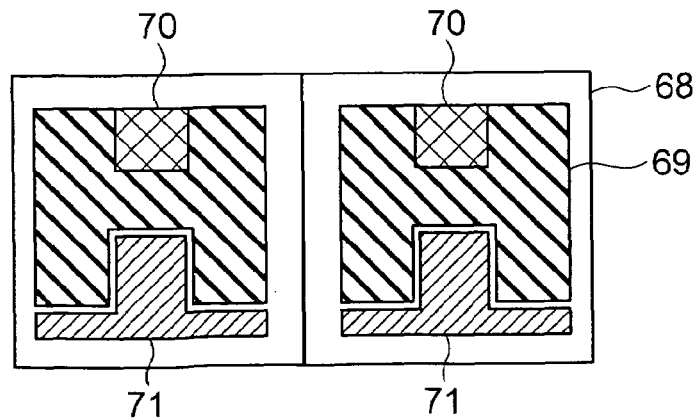
FIG. 53 is a top view showing yet still another electrode pattern in the two-wire polarity corresponding mount type light emitting diode element structure of the invention.

With the aim of improving the emission efficiency in parallel drive, four LED unit elements, as compared to the conventional element structure, are integrated on the same substrate to form an emission layer as shown in FIG. 41. As in the precedence, the negative electrodes 71 in the LED pieces of FIG. 47 are merged in FIG. 48, so that mounting can be performed using half the number of wires, that is, two wires to be connected to the resultant electrodes of negative polarity. In FIG. 49, counterparts of the positive electrode 70 and those of negative electrode 71 in the LED unit elements of FIG. 47 are merged, respectively, so that the number of wires to the resultant electrodes of both polarities, respectively, can be reduced to two for mounting. In FIG. 50, the area of LED element structure is the same as that in FIG. 47 but four emission layers or regions are integrated in lateral direction on the same substrate and shaped in commensuration with the shape of substrate wiring. In FIG. 51, as in the precedence, negative electrodes 71 in the LED unit elements of FIG. 50 are merged, so that the number of wires to the resultant negative electrode can be halved or so to assure mounting by one or two wires. In FIG. 52, counterparts of positive electrode 70 and those of negative electrode 71 in the LED unit elements of FIG. 50 are merged, respectively, so that the number of wires to the resultant electrodes of both polarities can be reduced to assure mounting by the use of one or two wires.

Figure 54:
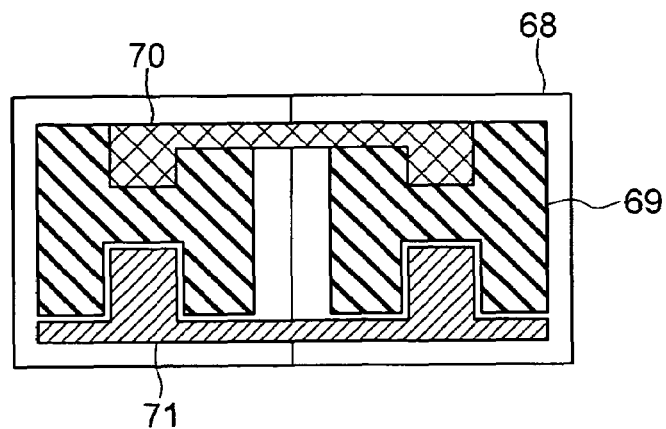
FIG. 54 is a top view showing yet still another electrode pattern in the two-wire polarity corresponding mount type light emitting diode element structure of the invention.
Figure 55:
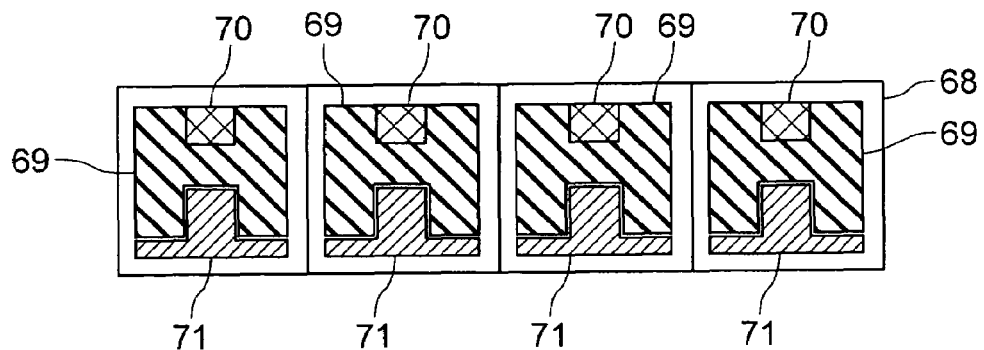
FIG. 55 is a top view showing yet still another electrode pattern in the two-wire polarity corresponding mount type light emitting diode element structure of the invention.
Figure 56:
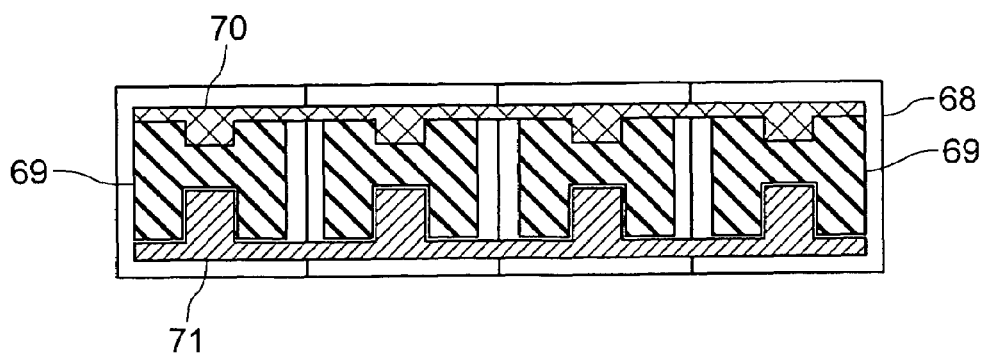
FIG. 56 is a top view showing yet still another electrode pattern in the two-wire polarity corresponding mount type light emitting diode element structure of the invention.

The electrode structure of LED element structure can be changed in accordance with the shape of wiring substrate and the utilization of light source as well so that the shape and LED element structure of the present embodiment can be processed as necessarily through design. In an LED element structure of FIG. 53, a positive electrode 70 and a negative electrode 71 are not positioned diagonally of a unit element but are positioned on the opposite sides of the unit element (emission layer region) to confront through the center portion. Then, two light emission layer regions are integrated in lateral direction on the same substrate, being shaped to comply with the shape of a substrate wiring. In FIG. 54, counterparts of positive electrode 70 and those of negative electrode 71 are merged, respectively, so that mounting can be performed with the number of wires to the resultant electrodes of both polarities, respectively, reduced to one or two. In FIG. 55, four emission layer regions are integrated in lateral direction on the same substrate, being shaped to comply with the shape of a substrate wiring. In FIG. 56, as in the precedence, counterparts of positive electrode 70 and those of negative electrode 71 are merged, respectively, so that mounting can be performed with the number of wires to the resultant electrodes of both polarities, respectively, reduced to one.

Figure 57:
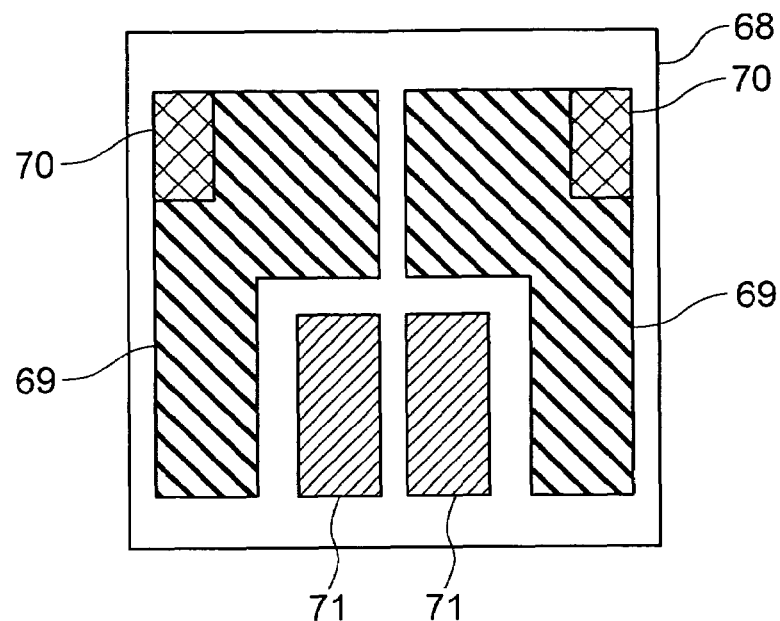
FIG. 57 is a top view showing yet still another electrode pattern in the two-wire polarity corresponding mount type light emitting diode element structure of the invention.
Figure 58:
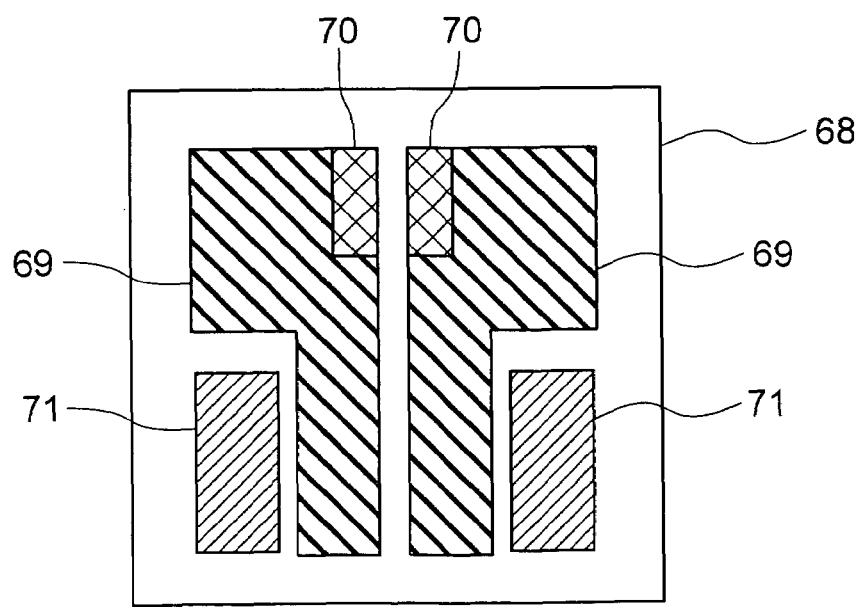
FIG. 58 is a top view showing yet still another electrode pattern in the two-wire polarity corresponding mount type light emitting diode element structure of the invention.

It is also expected that the emission efficiency can be improved through parallel drive when the emission layer is divided into a plurality of regions on the same substrate. In FIG. 57 or 58, the region of emission layer of FIG. 43 representing the conventional element structure is divided and each electrode is sized within a range permitted for wire-bonding mounting, thus providing a mounting structure to be driven in parallel. Even in the conventional 0.3 mm square or 0.2 mm square LED structure size, the emission layer can be divided for parallel drive conducive to an improved emission efficiency under drive conditions that uniform current distribution is promoted within a range in which the current density is not extremely highly enhanced and an extreme temperature rise is suppressed. On the other hand, the diode piece size is small and the area of emission region is small, resulting in insufficient improvements in high brightness characteristics.

Figure 59:
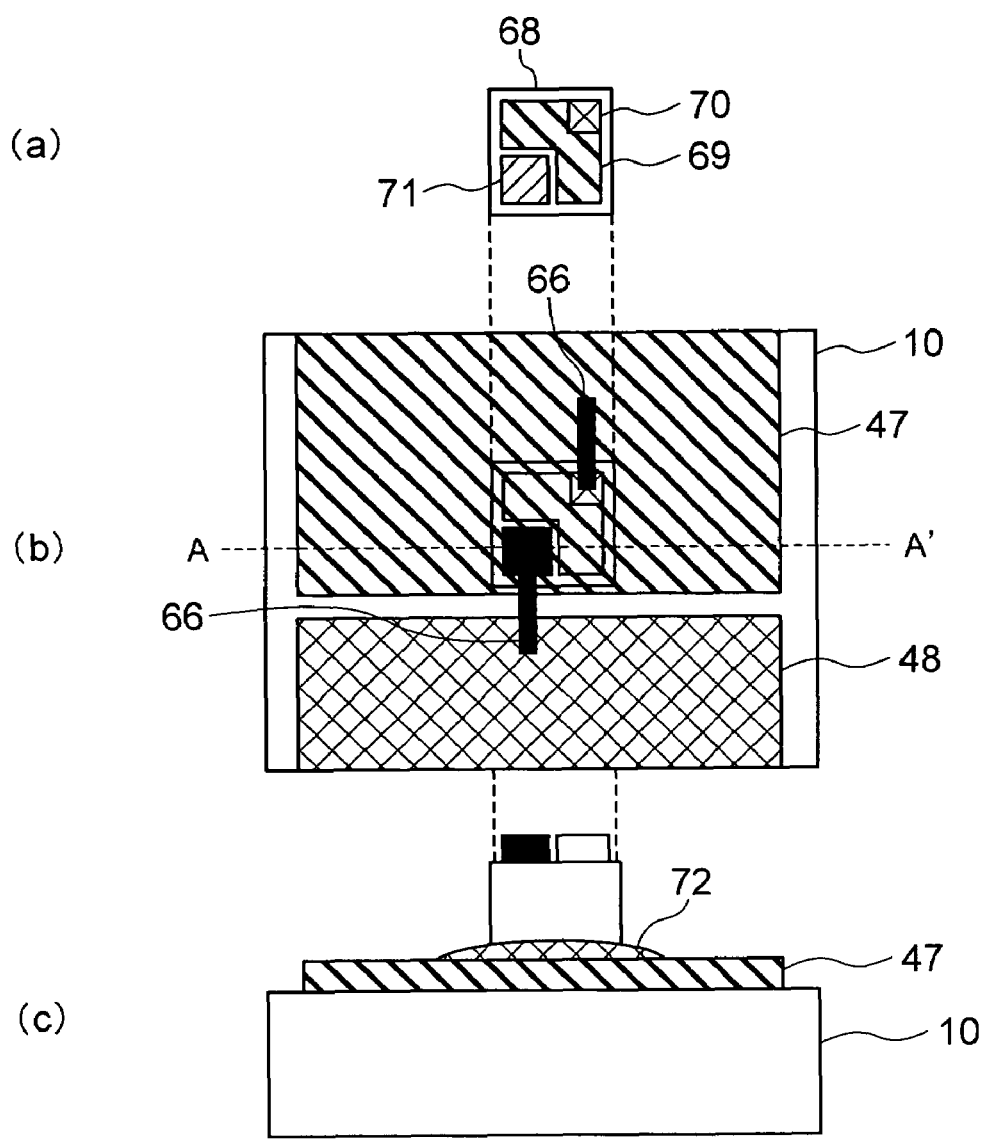
FIG. 59 illustrates at section (a) a top view showing a two-wire polarity corresponding mount type light emitting diode element structure having a conventional electrode pattern arrangement structure, at section (b) a top view showing a wiring substrate having a wiring pattern corresponding to the conventional electrode pattern arrangement structure of element structure and the two-wire polarity corresponding mount type light emitting diode element mounted on the substrate and at section (c) a sectional view showing the wiring substrate having a wiring pattern corresponding to the conventional electrode pattern arrangement structure of element and the two-wire polarity corresponding mount type light emitting diode element structure mounted on the substrate.
Figure 60:
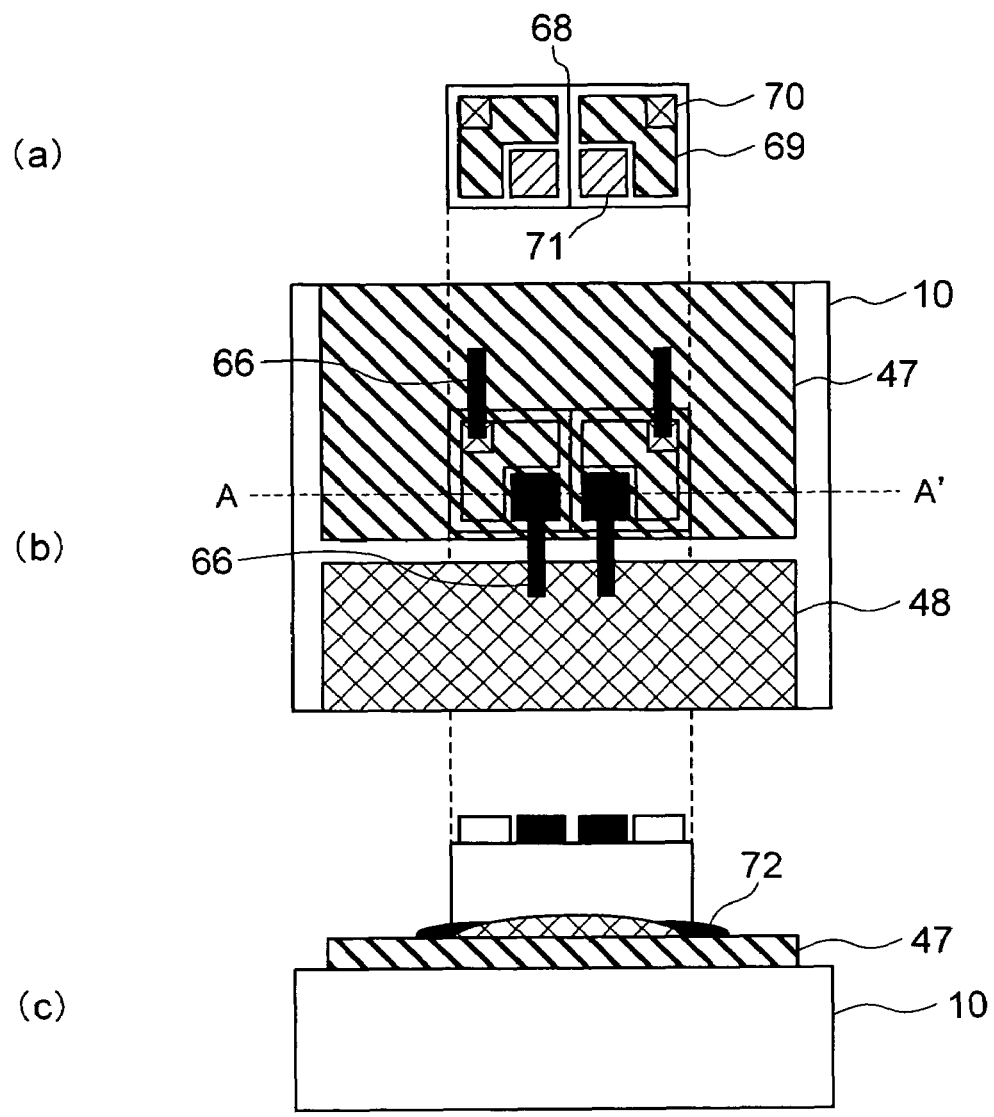
FIG. 60 illustrates at section (a) a top view showing a two-wire polarity corresponding mount type light emitting diode element structure having an electrode pattern arrangement structure of the invention, at section (b) a top view showing a wiring substrate having a wiring pattern corresponding to the electrode pattern arrangement structure of element of the invention and the two-wire polarity corresponding mount type light emitting diode element structure mounted on the substrate and at section (c) a sectional view showing the wiring substrate having a wiring pattern corresponding to the electrode pattern arrangement structure of element of the invention and the two-wire polarity corresponding mount type light emitting diode element structure mounted on the substrate.
Figure 61:
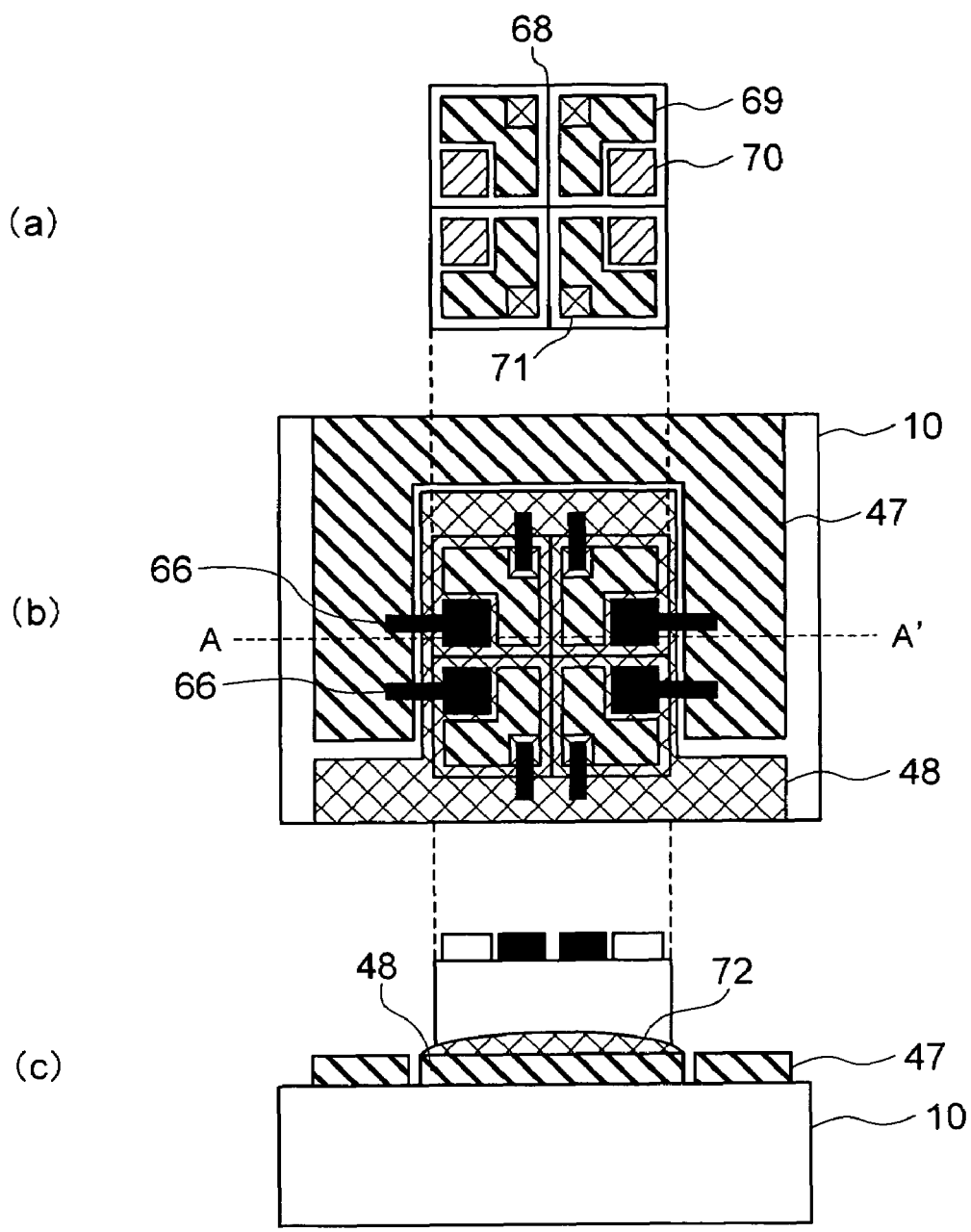
FIG. 61 illustrates at (a) a top view showing a two-wire polarity corresponding mount type light emitting diode element structure having another electrode pattern arrangement structure of the invention, at (b) a top view showing a wiring substrate having a wiring pattern corresponding to that electrode pattern arrangement structure of element of the invention and the two-wire polarity corresponding mount type light emitting diode element structure mounted on the substrate and at (c) a sectional view showing the wiring substrate having a wiring pattern corresponding to that electrode pattern arrangement structure of element of the invention and the two-wire polarity corresponding mount type light emitting diode element structure mounted on the substrate.
Figure 62:
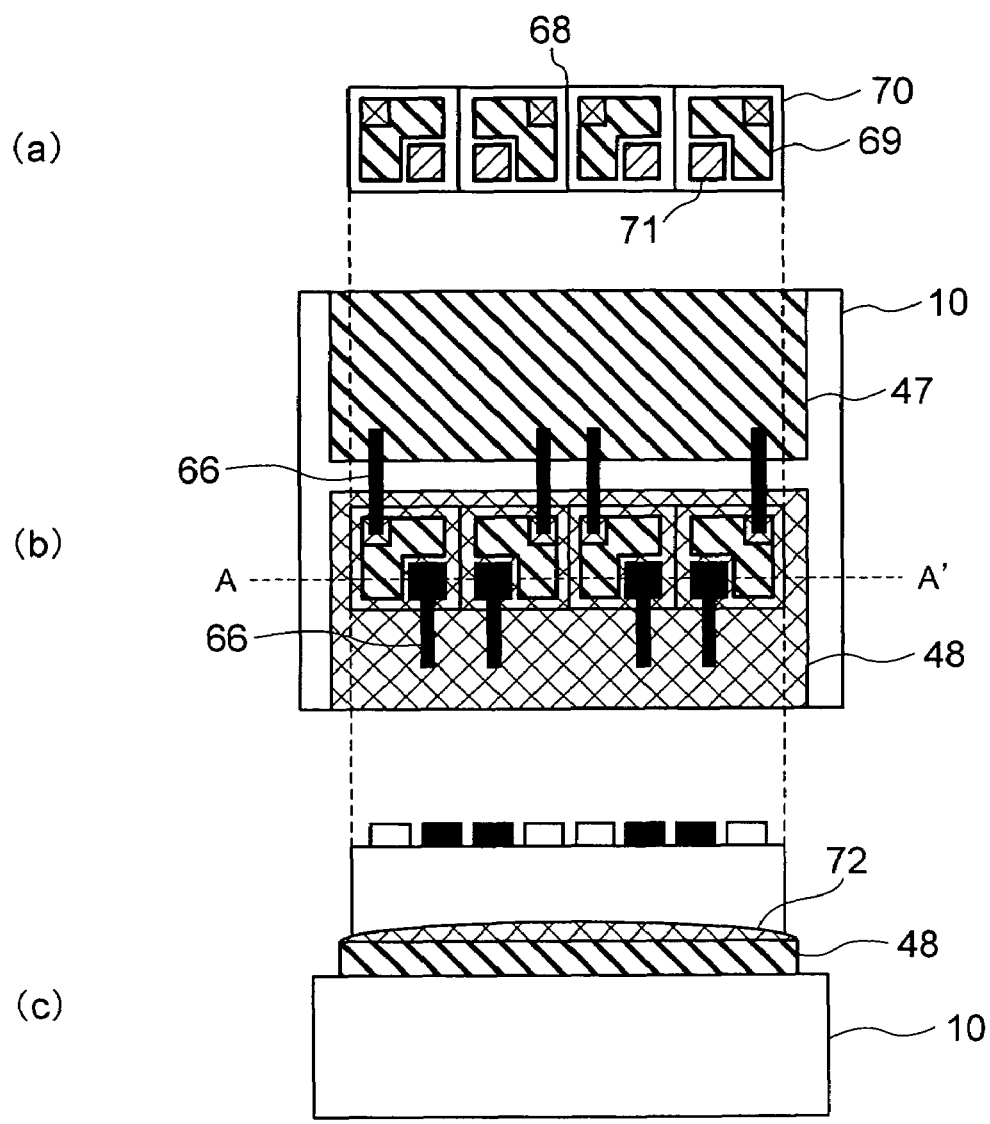
FIG. 62 illustrates at (a) a top view showing a two-wire polarity corresponding mount type light emitting diode element structure having still another electrode pattern arrangement structure of the invention, at (b) a top view showing a wiring substrate having a wiring pattern corresponding to that electrode pattern arrangement structure of element of the invention and the two-wire polarity corresponding mount type light emitting diode element structure mounted on the substrate and at (c) a sectional view showing the wiring substrate having a wiring pattern corresponding to that electrode pattern arrangement structure of element of the invention and the two-wire polarity corresponding mount type light emitting diode element structure mounted on the substrate.

In FIG. 59, there are illustrated a top view of the conventional element structure at section (a), a top view showing wire bonding mounting on a wiring substrate at section (b) and a structure in which die bonding mounting is done on the wiring substrate by using paste bonding resin 72 at section (c). In FIG. 60, 61 or 62, there are illustrated a top view of the LED element structure of the present embodiment at section (a), a top view showing wire bonding mounting on a wiring substrate at section (b) and a structure in which wire bonding mounting is done on the wiring substrate by using paste bonding resin 72 at section (c). They can be designed in compliance with kinds of utilization of light source by taking the element structure and the electrode structure.

Figure 63:
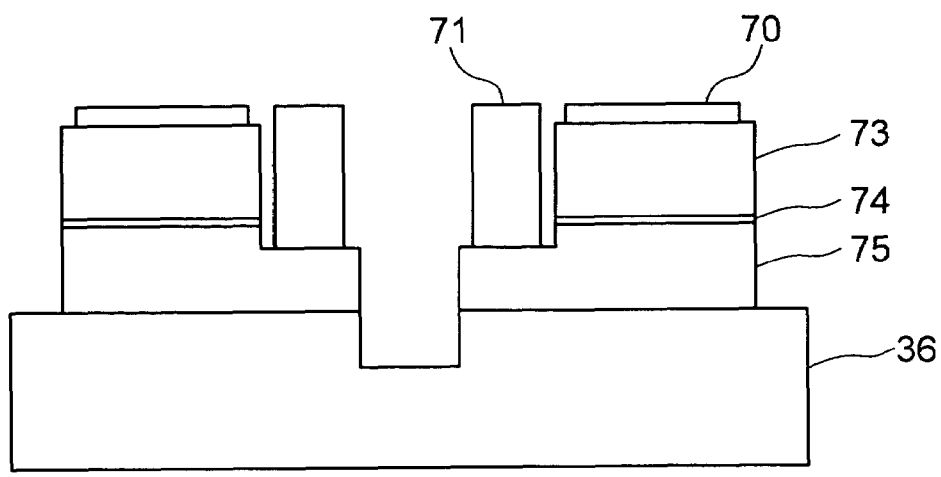
FIG. 63 is a sectional view showing a two-wire polarity corresponding mount type light emitting diode element structure having an electrical isolation separation groove in the present invention.
Figure 64:
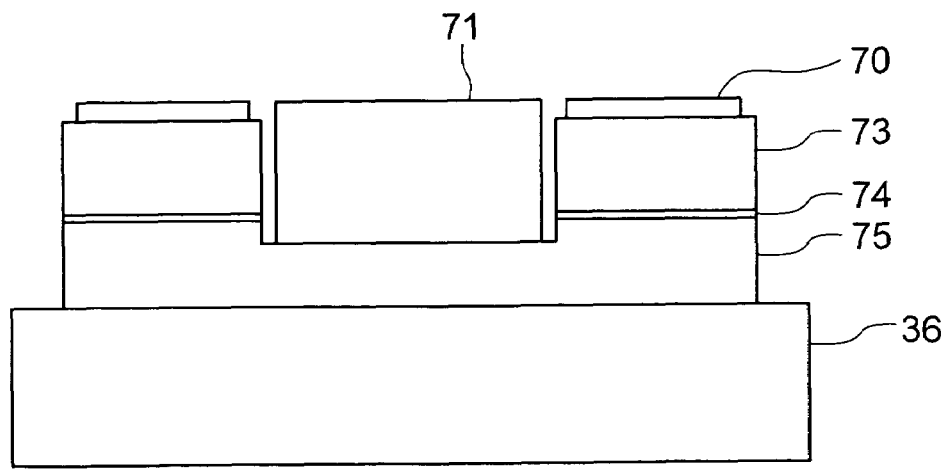
FIG. 64 is a sectional view showing a two-wire polarity corresponding mount type light emitting diode element structure having a separation groove for a light emitting layer in the invention.

According to the present embodiment, the LED element structure can be constructed by integrating a plurality of emission layer regions or dividing the emission layer into a plurality of regions on the same substrate and in this case, separation of emission layer and electrical separation can be carried out as will be described below. In the present embodiment, at least the emission layer is divided into individual regions on the same substrate which in turn are separated physically. In FIG. 63, in n-type semiconductor layer 75, emission layer 74 and p-type semiconductor layer 73 which are provided on a substrate 36, the emission layer 74 is separated through etching process to provide a negative electrode 71 and the n-type semiconductor layer 75 is electrically separated into left and right regions in lateral direction by means of an isolation separation groove. In FIG. 64, in order to simplify wire bonding mounting and reduce the number of wires, a negative electrode 71 to be vapor-deposited on the n-type semiconductor layer is shared. Such a mounting structure can be handled as design specifications in accordance with characteristics and structure of the element and kinds of utilization of the wiring substrate and kinds of utilization of light source.

Figure 65:
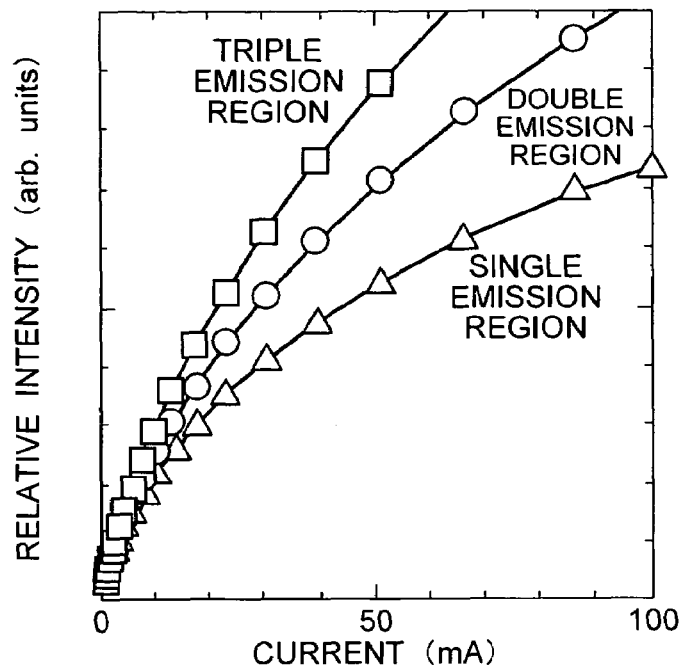
FIG. 65 is a graph showing emission intensity versus current characteristics dependent on the emission region size of the two-wire polarity corresponding mount type light emitting diode element structure having the electrical isolation separation groove in the invention.
Figure 66:
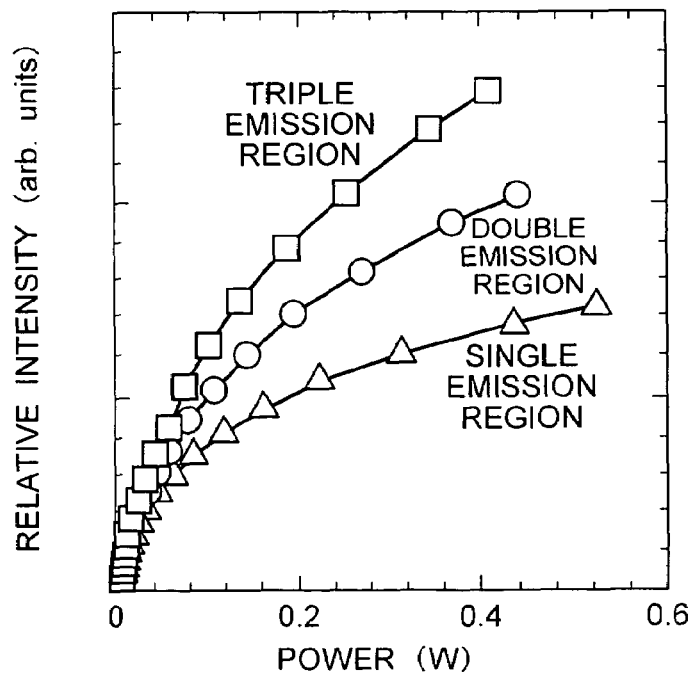
FIG. 66 is a graph showing emission intensity versus power characteristics dependent on the emission region size of the two-wire polarity corresponding mount type light emitting diode element structure having the electrical isolation separation groove in the invention.

Characteristics of the LED element structure according to the present embodiment are evaluated, obtaining results as described below. The area of the emission region on the same substrate is changed to measure emission intensities due to current injection and evaluated measurement results are shown in FIG. 65. Also, emission intensities in relation to supplied electric energy are measured and evaluated, obtaining results as shown in FIG. 66. It has been found that as the emission region size becomes twice and triple as compared to the conventional element structure, the characteristics of the element structure can be improved by about 1.25 times and 1.5 times, respectively. Throughout the element structure, an advantage of increased total light flux due to integrating sphere can be found. Since the electric energy can reduce for the same current in accordance with the area of element structure, the emission efficiency can also be improved.

Figure 67:
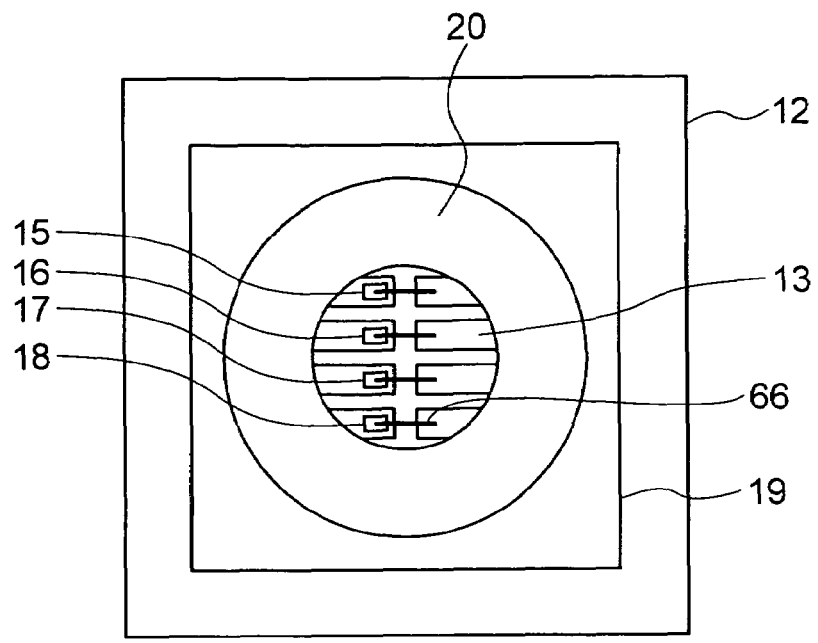
FIG. 67 is a top view showing a cell package carrying the two-wire polarity corresponding mount type light emitting diode unit element of the invention.

By individually mounting the LED pieces of RGB according to the present embodiment in the package structure, a white light source controllable independently can be produced. Referring to FIG. 67, there is illustrated in top view form a structure in which like embodiment 1, four pieces of RGGB are mounted in one package through die bonding and wire bonding. The packages are integrated as a unit structure of FIG. 4 or 5 in embodiment 1 and further, unit structures are arranged to form, for example, the housing structure of FIG. 3 and the backlight structure of FIG. 1. Thus, the backlight module for liquid crystal television and display apparatus as well can be provided.

The light emitting diode element structure and mounting form according to the present embodiment can be applied to not only the liquid crystal panel display apparatus for small-size and large-size televisions but also a light source of illumination unit or backlight light sources of a liquid crystal panel for personal computer and a car navigation device.

Embodiment 6

Figure 68:
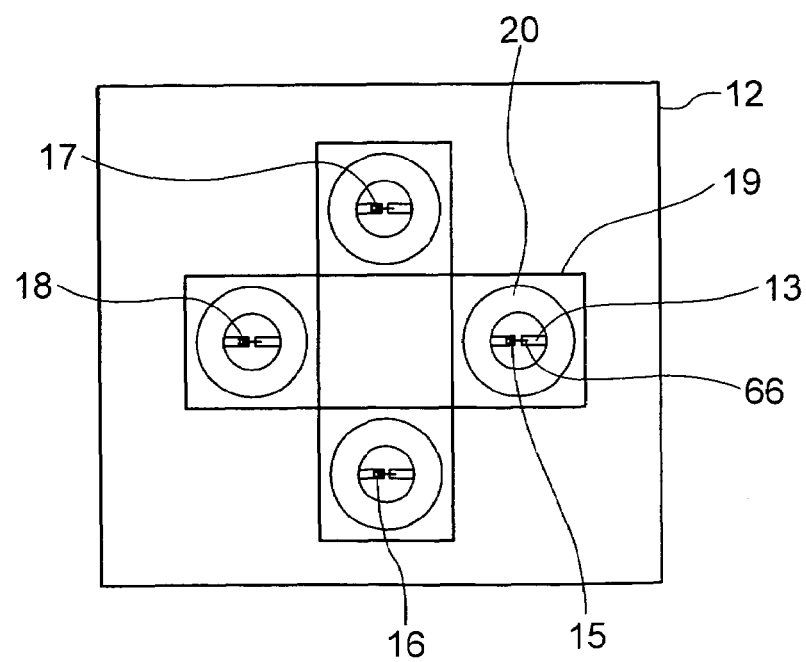
FIG. 68 is a top view showing another cell package carrying the two-wire polarity corresponding mount type light emitting diode unit element of the invention.

A sixth embodiment of the invention will be described with reference to FIG. 68. While in embodiment 5 the LED pieces of the invention are wire-bonding mounted to one package, respective RGGB diode pieces are packaged independently in the present embodiment. Through this, the size of package, the size and shape of reflection plate and the width and shape of wiring can be adjusted for individual LED pieces which are sized and shaped differently. Therefore, tolerance of design of package and wiring can be assured and hence design specifications and utilizations in a wide range can be available to advantage.

The light emitting diode element structure and mounting form of the present embodiment can also be applied to not only the liquid crystal panel display apparatus for small-size and large-size televisions but also, a light source of illumination unit or backlight light sources of a liquid crystal panel for personal computer and a car navigation device.

Embodiment 7

Figure 69:
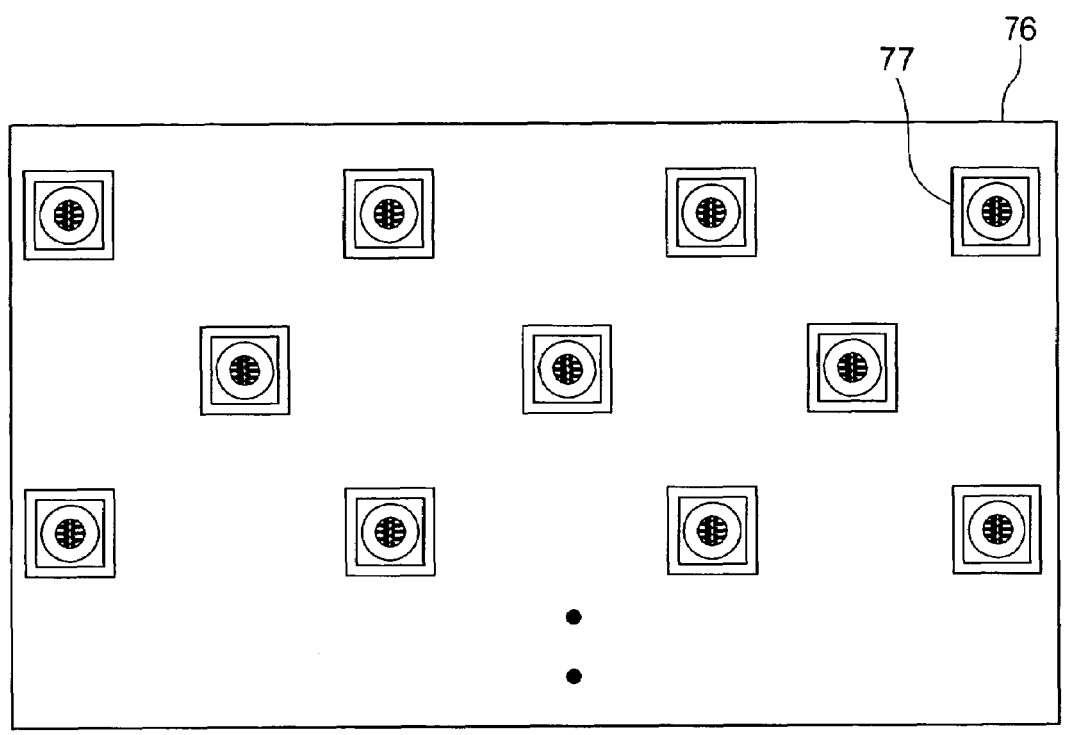
FIG. 69 is a sectional diagram showing a backlight housing in which the cell packages each carrying a light emitting unit element of the invention are arranged.

A seventh embodiment of the invention will now be described with reference to FIG. 69. Embodiments 1 to 5 presuppose that the LED unit element of the invention is mounted to a package and then, unit structures having cell packages are carried in a housing of FIG. 3 in a square lattice shaped and spaceless fashion but in the present embodiment, packages are arranged discretely and in a triangle lattice shaped fashion in the housing, as shown in FIG. 69. Thus, in the present embodiment, the housing package arrangement has a less number of packages and low consumptive power and low costs can be envisaged. This is because with the LED element structure of the invention, improvements in quantity of light and improvements in emission efficiency can be expected for the same electric energy and therefore, the number of packages to be carried in the housing and the manner of arrangement can be set so as to be minimized and optimized pursuant to specifications. Further, for the sake of attaining brightness and chromatic homogeneity of the backlight, optical design for optical enlargement can be relatively facilitated. Depending on design of optical sheet and lens, the number of packages can be expected to be further reduced to advantage. Advantageously, this can further expedite low consumptive power and low costs.

The light emitting diode element structure and mounting form of the present embodiment can also be applied to not only the liquid crystal panel display apparatus for small-size and large-size televisions but also, a light source of illumination unit or backlight light sources of a liquid crystal panel for personal computer and a car navigation device.

The teachings of the invention can be applied to a white light source of high emission efficiency and high output with high brightness, backlight modules of a liquid crystal display apparatus for large-size liquid crystal television and a medium/small type liquid crystal display apparatus for cell phone and personal computer as well and a light source of backlight.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A liquid crystal display apparatus comprising:
   a liquid crystal panel;
   an optical system; and
   a light source;
   wherein said light source includes a light emitting element structure having positive and negative electrodes, at least one of them being plural, and wires mounted to said positive and negative electrodes by making electrical correspondence to individual regions of said positive and negative electrodes; and
   wherein said light emitting element structure has a positive electrode constructed as mergence of singular positive electrodes of individual light emitting unit elements of minimum unit and a negative electrode constructed of mergence of singular negative electrodes of the individual light emitting unit elements of minimum unit, said light emitting unit elements of minimum unit being divisions of said light emitting element structure on the same substrate.

2. A liquid crystal display apparatus according to claim 1, wherein said light emitting element structure has the positive electrode constructed as mergence of a singular positive electrode of the individual light emitting unit elements of minimum unit and the negative electrode constructed as mergence of singular negative electrodes of said individual light emitting unit elements of minimum unit, whereby said light emitting element structure has a light intensity corresponding to the sum of light intensities of plural light emitting unit elements.

3. A liquid crystal display apparatus according to claim 1, wherein a plurality of light emitting unit elements of minimum unit having each a singular positive electrode and a singular negative electrode are mounted in parallel to corresponding wires.

4. A liquid crystal display apparatus according to claim 1, wherein a plurality of said light emitting unit elements of minimum unit are mounted in series by means of said wires.

5. A liquid crystal display apparatus according to claim 1, wherein said light emitting unit element of minimum unit is arranged cyclically so that its positive electrode or negative electrode may be merged.

6. A liquid crystal display apparatus according to claim 5, wherein every two, three or four of said light emitting unit elements of minimum unit are arranged cyclically.

7. A liquid crystal display apparatus according to claim 1, wherein said wires are laid on a metallic substrate through an insulating layer and said light emitting element structure has a breakdown voltage of 1 kV or more.

8. A liquid crystal display apparatus according to claim 1, wherein said wires are laid on a ceramic substrate through an insulating layer and said light emitting element structure has a breakdown voltage of 1 kV or more.

9. A liquid display apparatus according to claim 1, wherein said light emitting unit element of minimum unit is a white light emitting element including a yellow fluorescent substance and a blue light emitting diode piece which are sealed with resin, a white light emitting element including green and red fluorescent substances and a blue light emitting diode piece which are sealed with resin or a white light emitting element including a three primary color light source of blue, green and red light emitting diode pieces which are sealed with resin.

10. A liquid crystal display apparatus according to claim 1, wherein said light source is used as a backlight of a liquid crystal display for a cell phone, personal computer or television.

11. A liquid crystal display apparatus comprising:
a liquid crystal panel;
an optical system; and
a light source;
wherein said light source includes a light emitting element structure having positive and negative electrodes, at least one of them being plural, and wires mounted to said positive and negative electrodes by making electrical correspondence to individual regions of said positive and negative electrodes; and
wherein said light emitting element structure is flip-chip mounted to said wires.

12. A liquid crystal display apparatus according to claim 1, wherein a plurality of light emitting unit elements of minimum unit each having a singular positive electrode and a singular negative electrode are connected in parallel to corresponding wires to form a parallel circuit.

13. A light source comprising:
a substrate;
a plurality of wires laid on said substrate; and
a plurality of light emitting unit elements each having a positive electrode and a negative electrode which are connected to corresponding wires,
wherein said plurality of light emitting unit elements are formed in such a pattern that positive electrodes or negative electrodes may be merged every two or more or light emitting unit elements.

14. A light source according to claim 13, wherein said light emitting unit elements formed in pattern are connected to said wires in every two or more pattern-formed light emitting unit elements.

15. A light source according to claim 13, wherein said light emitting unit element is flip-chip mounted to said wires.

16. A light source according to claim 13, wherein said pattern-formed light emitting unit elements are connected in parallel with said wires and are also connected in series with said wires in every two or more pattern-formed light emitting unit elements.

17. A light source according to claim 13, wherein said pattern-formed light emitting unit element includes two, three or four light emitting diode pieces.

18. A liquid crystal display apparatus comprising:
the light source as recited in claim 13; and
a liquid crystal panel.

19. The light source according to claim 13, wherein said light emitting unit element is wire-bonding mounted to said wires.

* * * * *